US010636849B2

(12) United States Patent
Jeong et al.

(10) Patent No.: US 10,636,849 B2
(45) Date of Patent: Apr. 28, 2020

(54) ORGANIC LIGHT-EMITTING DISPLAY DEVICE

(71) Applicant: LG Display Co., Ltd., Seoul (KR)

(72) Inventors: Hae-Yeon Jeong, Osan-si (KR); Jong-Hyun Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 145 days.

(21) Appl. No.: 15/698,582

(22) Filed: Sep. 7, 2017

(65) Prior Publication Data

US 2018/0097039 A1    Apr. 5, 2018

(30) Foreign Application Priority Data

Sep. 30, 2016    (KR) .......................... 10-2016-0127058

(51) Int. Cl.
| | |
|---|---|
| *G06F 3/041* | (2006.01) |
| *H01L 27/32* | (2006.01) |
| *G09G 3/32* | (2016.01) |
| *G06F 3/044* | (2006.01) |
| *H01L 51/52* | (2006.01) |

(52) U.S. Cl.
CPC ............ *H01L 27/323* (2013.01); *G06F 3/044* (2013.01); *G06F 3/0412* (2013.01); *G09G 3/32* (2013.01); *H01L 27/3216* (2013.01); *H01L 27/3246* (2013.01); *H01L 51/5253* (2013.01); *G06F 2203/04102* (2013.01); *G06F 2203/04111* (2013.01); *G06F 2203/04112* (2013.01); *H01L 27/3213* (2013.01)

(58) Field of Classification Search
CPC ....... G06F 3/0412; G06F 3/044; G06F 3/0416
See application file for complete search history.

(56) References Cited

U.S. PATENT DOCUMENTS

| | | | | |
|---|---|---|---|---|
| 8,599,150 | B2 | 12/2013 | Philipp | |
| 8,599,161 | B2 | 12/2013 | Philipp | |
| 9,551,904 | B2 | 1/2017 | Philipp | |
| 2011/0050604 | A1* | 3/2011 | Kwon | ................... G06F 3/0412 345/173 |
| 2011/0102361 | A1 | 5/2011 | Philipp | |
| 2012/0081324 | A1 | 4/2012 | Philipp | |
| 2012/0162116 | A1 | 6/2012 | Philipp | |

(Continued)

FOREIGN PATENT DOCUMENTS

DE    10 2010 043055 A1    5/2011

OTHER PUBLICATIONS

European Search Report and European Patent Application No. EP 17185447, dated Jan. 25, 2018, 7 Pages.

(Continued)

*Primary Examiner* — Nan-Ying Yang
(74) *Attorney, Agent, or Firm* — Fenwick & West LLP

(57) ABSTRACT

An organic light-emitting display device includes an organic light-emitting array including a plurality of pixel areas, the pixel areas being arranged in a matrix; and a plurality of blocks, in each of which a plurality of touch wires are arranged in a first direction and a second direction. Each of the sub-pixels has a light-emitting part, the light-emitting part of one of the sub-pixels is larger than the light-emitting parts of the other sub-pixels, and an intersection of the touch wires arranged in the first direction and the second direction is located in the sub-pixel having the largest light-emitting part.

20 Claims, 17 Drawing Sheets

(56) References Cited

U.S. PATENT DOCUMENTS

| | | |
|---|---|---|
| 2013/0100054 A1 | 4/2013 | Philipp |
| 2014/0091286 A1* | 4/2014 | Ma ................... H03K 17/962 257/40 |
| 2014/0184937 A1* | 7/2014 | Lim ................... H01L 27/323 349/12 |
| 2014/0218308 A1* | 8/2014 | Yeh .................... G06F 3/041 345/173 |
| 2014/0293154 A1 | 10/2014 | Philipp |
| 2015/0261370 A1* | 9/2015 | Yoo ................... G06F 3/0412 345/173 |
| 2018/0039360 A1* | 2/2018 | Akimoto ........... G06F 3/0412 |
| 2018/0090544 A1* | 3/2018 | Gunji ................ G06F 3/0412 |

OTHER PUBLICATIONS

European Patent Office, Communication Pursuant to Article 94(3) EPC, EP Patent Application No. 17185447.4, dated Jun. 12, 2019, four pages.

\* cited by examiner

ORGANIC LIGHT-EMITTING DISPLAY DEVICE

This application claims the benefit of Korean Patent Application No. 10-2016-0127058, filed on Sep. 30, 2016, which is hereby incorporated by reference as if fully set forth herein.

BACKGROUND

Field of the Invention

The present invention relates to a display device, and more particularly to an organic light-emitting display device that is capable of preventing touch wires from being visible in a structure in which a touch panel is integrated into the organic light-emitting display device and that is capable of solving a problem with a color viewing angle even in a structure in which a non-light-emitting part is narrow.

Discussion of the Related Art

Examples of display devices include a liquid crystal display (LCD) device, an organic light-emitting display device, a plasma display panel (PDP) device, a quantum dot display device, a field emission display (FED) device, and an electrophoretic display (EPD) device. Each of these devices includes a flat display panel for displaying an image. The flat display panel is configured by laminating a pair of transparent insulating substrates in the state in which an inherent light-emitting or polarizing layer or another optical material layer is disposed therebetween.

Among the above-mentioned devices, the organic light-emitting display device has lately attracted considerable attention, because the organic light-emitting display device is lightweight due to the omission of a light source and achieves improved color expression.

With the recent increase in size of display devices, the demand for display devices that occupy little space has increased. In addition, the demand for flexible display devices has also increased.

As a result, the thickness of the display devices has been gradually reduced, and bendable display devices or rollable display devices, which are capable of being bent or rolled, have attracted attention.

It is required for such display devices to further include a touch panel having a touch detection function in addition to a simple display function, in order to satisfy specific demands of users.

To this end, an organic light-emitting display device, in which a touch panel and an organic light-emitting array are laminated, has been proposed. However, the touch panel is manufactured through a process different from the process for manufacturing the organic light-emitting array, and includes additional wires. For these reasons, conventional organic light-emitting display devices have problems in that the wires of the touch panel are visible in sub-pixels defined by the organic light-emitting array. In particular, the touch panel is manufactured through a process different from the process for manufacturing the organic light-emitting array, and is then laminated with the organic light-emitting array to constitute the organic light-emitting display device. In the case in which shielding touch wires are non-uniformly located in respective areas of the organic light-emitting array, the visibilities of the touch wires in the respective areas of the organic light-emitting array are different from each other, which deteriorates the visual sensation experienced by the user.

The problem with the visibility becomes more serious when the angle at which the user views the organic light-emitting display device is changed. In addition, in a structure in which a non-light-emitting part of the organic light-emitting array is reduced, the wires of the touch panel pass through the light-emitting parts, with the result that the wires of the touch panel are more easily visible in the light-emitting parts.

SUMMARY

Accordingly, the present disclosure is directed to an organic light-emitting display device that reduces one or more problems due to limitations and disadvantages of the related art.

An objective of the present disclosure is to provide an organic light-emitting display device that is capable of preventing touch wires from being visible in a structure in which a touch panel is integrated into the organic light-emitting display device and that is capable of reducing a problem with a color viewing angle even in a structure in which a non-light-emitting part is narrow.

Additional advantages, objectives, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An organic light-emitting display device of the present disclosure is configured such that touch wires of a touch electrode array correspond to specific positions of sub-pixels, thereby preventing the touch wires from being visible.

To achieve these objectives and other advantages and in accordance with the purpose of the present disclosure, as embodied and broadly described herein, an organic light-emitting display device includes an organic light-emitting array including a plurality of pixel areas, the pixel areas being arranged in a matrix; and a plurality of blocks, in each of which a plurality of touch wires are arranged in a first direction and a second direction. Each of the sub-pixels has a light-emitting part, the light-emitting part of one of the sub-pixels is larger than the light-emitting parts of the other sub-pixels, and an intersection of the touch wires arranged in the first direction and the second direction is located in the sub-pixel having the largest light-emitting part.

Each of the sub-pixels may further include a bank around the light-emitting part.

The light-emitting part of at least one of the other sub-pixels, excluding the sub-pixel having the largest light-emitting part, may correspond to only one selected from between the touch wire arranged in the first direction and the touch wire arranged in the second direction.

The touch wire arranged in the first direction or the second direction may be located in the bank of at least one of the other sub-pixels, excluding the sub-pixel having the largest light-emitting part.

The sub-pixels of the pixel areas having the largest light-emitting parts may emit the same color.

The intersection of the touch wires arranged in the first direction and the second direction may be located at the same positions of the sub-pixels of the pixel areas having the largest light-emitting parts.

Each of the blocks may include a plurality of transmission parts arranged in a third direction and a plurality of reception parts arranged in a fourth direction, the transmission parts and the reception parts intersecting each other. One selected from between the transmission parts and the reception parts may have a connection electrode, provided at touch wires of adjacent blocks, between the adjacent blocks; and the other selected from between the transmission parts and the reception parts may have a bridge electrode, provided on a layer different from a layer on which the touch wires of the adjacent blocks are provided, between the adjacent blocks.

The touch electrode array may further include an island-shaped transparent conductive layer that abuts on the intersection of the touch wires. In this case, the island-shaped transparent conductive layer may have a width larger than the widths of the touch wires in the first direction and the second direction.

The island-shaped transparent conductive layer may be provided at the intersection of the touch wires in the first direction and the second direction.

The touch wires may have the same width in the first direction and the second direction.

The organic light-emitting display device may further include an adhesive layer provided between the organic light-emitting array and the blocks.

The touch wires may be formed of one selected from among gold (Au), silver (Ag), palladium (Pd), copper (Cu), aluminum (Al), chrome (Cr), molybdenum (Mo), and titanium (Ti), or a metal stack or an alloy comprising at least one selected from among these.

In the organic light-emitting display device of the present disclosure, the ratio of the area of the touch wires to that of the light-emitting parts of the sub-pixels may be adjusted to a specific level or less in order to prevent the touch wires from being visible.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the invention. In the drawings.

DETAILED DESCRIPTION

Figure 1A:
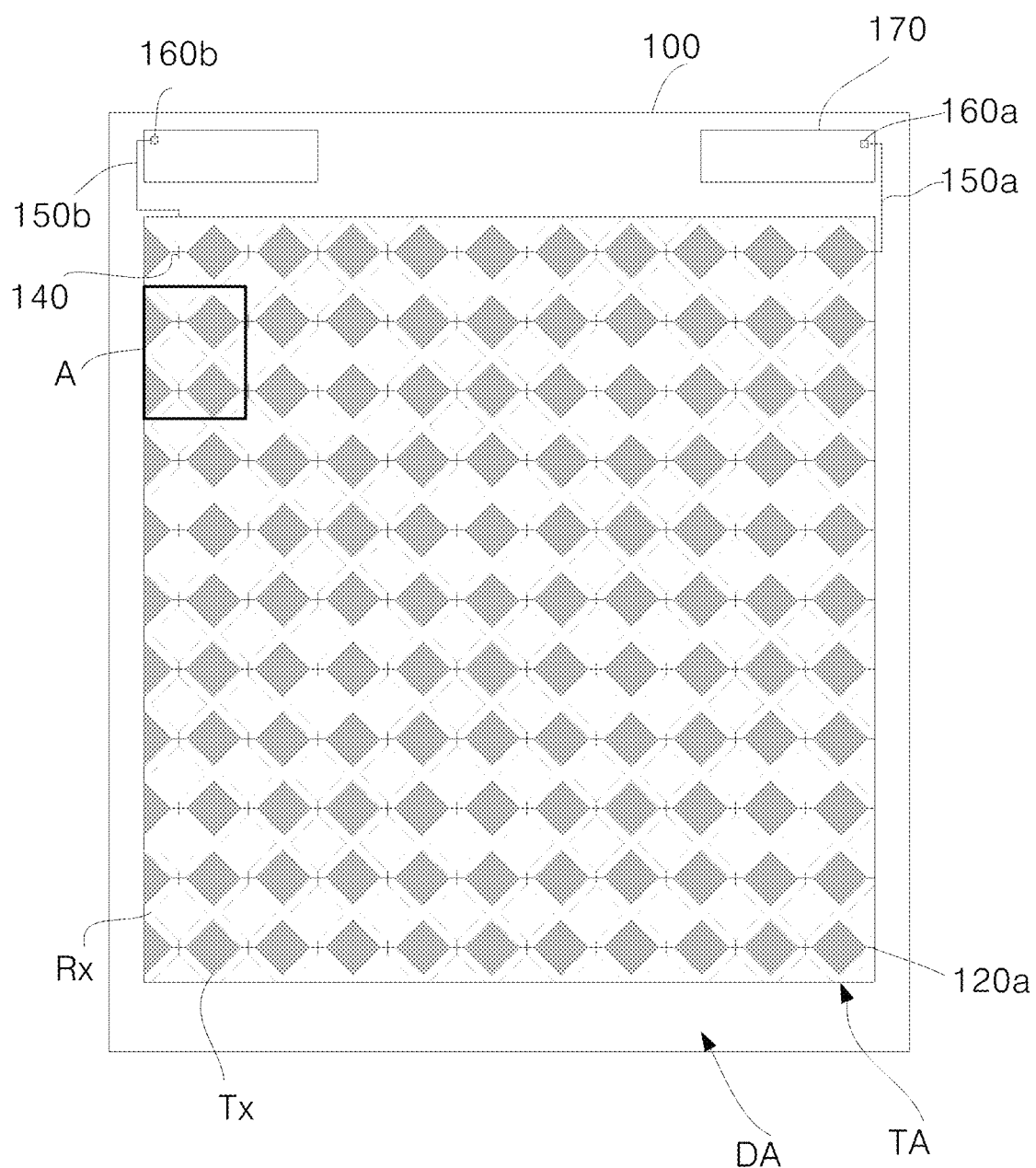
FIG. 1A is a plan view showing a touch panel, according to one embodiment.

Advantages and features of the present disclosure and a method of achieving the same will be more clearly understood from embodiments described below with reference to the accompanying drawings. However, the present disclosure is not limited to the following embodiments but may be implemented in various different forms. The embodiments are provided merely to complete disclosure of the present invention and to fully provide a person having ordinary skill in the art to which the present disclosure pertains with the category of the disclosure. Consequently, the present invention is defined only by the category of the claims.

Shapes, sizes, rates, angles, numbers, etc. disclosed in the drawings to explain various embodiments of the present disclosure are illustrative, and are not limited to the particulars shown in the drawings. Wherever possible, the same reference numbers will be used throughout the specification to refer to the same or like elements. In the description of the present disclosure, certain detailed explanations of the related art are omitted when it is deemed that they may unnecessarily obscure the essence of the disclosure. In the case in which the terms "comprises," "has," or "includes" are used in this specification, other parts may be further added unless the term "only" is used. The singular forms are intended to include the plural forms as well, unless the context clearly indicates otherwise.

In interpreting components included in various embodiments of the present disclosure, it is to be interpreted that an error range is included unless the context clearly indicates otherwise.

In explaining various embodiments of the present disclosure, when a positional relationship is described, for example, when the positional relationship between two parts is described using terms such as "on", "above," "under," "beside," etc., one or more additional parts may be located between the two parts unless the term "immediately" or "directly" is used.

In explaining various embodiments of the present disclosure, when a temporal relationship is described, for example, when time sequences such as "after," "subsequently," "next," and "before" are described, discontinuous sequences may be included unless the term "immediately" or "directly" is used.

In explaining various embodiments of the present disclosure, the terms "first," "second," etc. are used to describe various elements. However, these terms are used only to distinguish between the elements. In this specification, therefore, a component identified by "first" may be identical to a component identified by "second" within the technical spirit of the present disclosure unless the context clearly indicates otherwise.

Features of various embodiments of the present disclosure may be partially or entirely coupled to or combined with each other, and may be technically interlocked and driven in various manners. Various embodiments may be realized independently or in combination with each other.

Figure 1B:
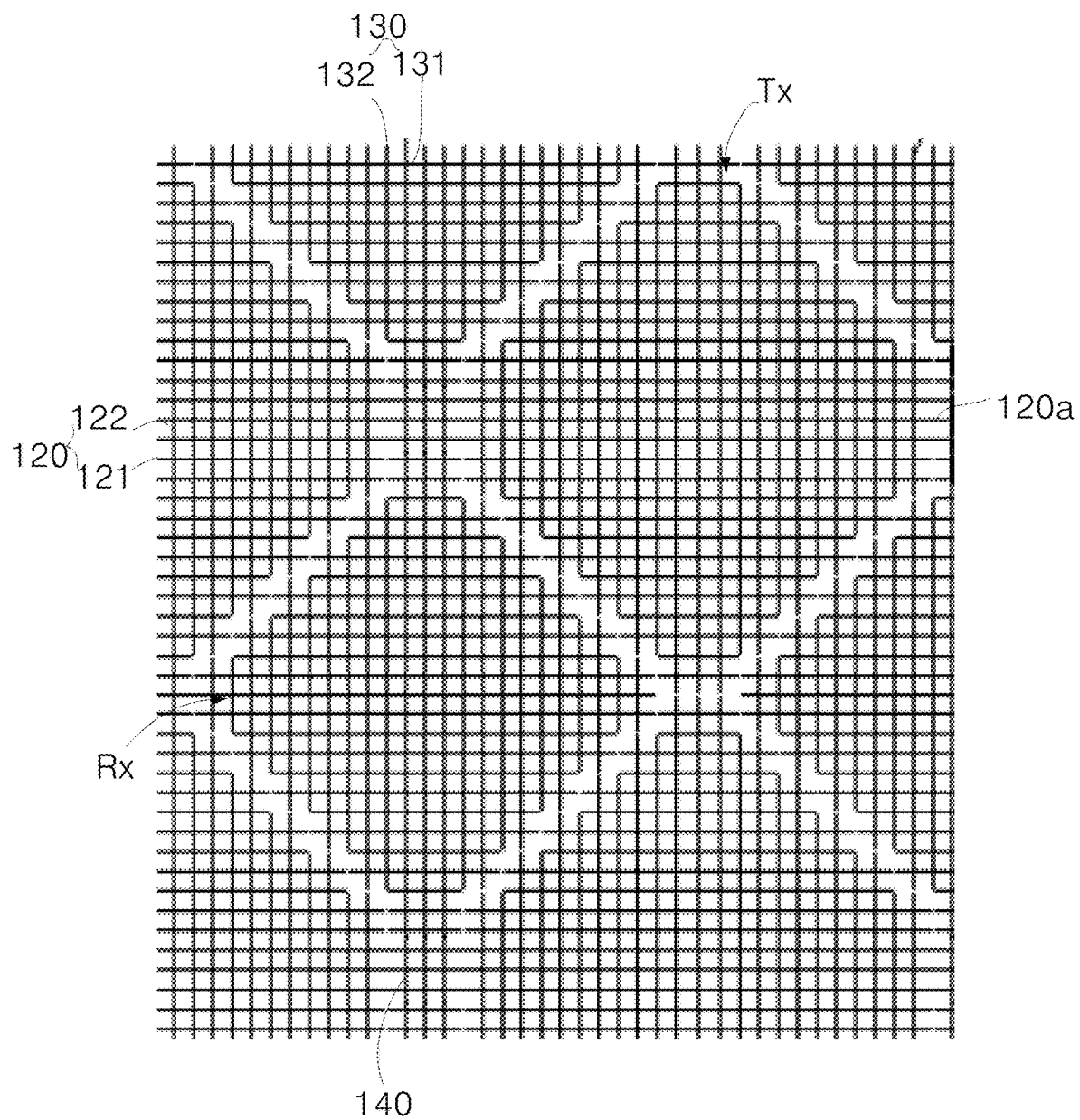
FIG. 1B is an enlarged plan view showing area A of FIG. 1A according to a first form of the touch panel, according to one embodiment.

FIG. 1A is a plan view showing a touch panel, and FIG. 1B is an enlarged plan view showing area A of FIG. 1A according to a first form of the touch panel.

As shown in FIG. 1A, a touch panel according to a first form of the present disclosure includes a plurality of transmission parts Tx and a plurality of reception parts Rx, which are arranged on a first substrate 100 in a direction in which the transmission parts Tx and the reception parts Rx intersect each other for touch detection. Each transmission part Tx is a kind of block having therein a plurality of first touch wires 120, each of which includes a first wire 121 extending in a first direction and a second wire 122 extending in a second direction, which is different from the first direction, as shown in FIG. 1B. The first and second wires 121 and 122 are integrated wires, which are not spaced apart from each other on the same layer but diverge from an intersection. When viewed in a plan view, the first touch wires 120 are configured such that wires having a small width are arranged in the form of a mesh in the area of each transmission part Tx. Each reception part Rx has therein a plurality of second touch wires 130, each of which includes a third wire 131 extending in a third direction and a fourth wire 132 extending in a fourth direction, which is different from the third direction, the second touch wires 130 being arranged in the form of a mesh. As shown in FIG. 1B, the third direction and the first direction may be the same, and the fourth direction and the second direction may be the same. However, the present invention is not limited thereto. The third direction and the fourth direction of the second touch wires 130 may be set differently from the first direction and the second direction of the first touch wires 120. In addition, as shown, the first direction and the second direction may be perpendicular to each other. However, the present invention is not limited thereto. The first direction and the second direction may intersect each other at an acute angle or an obtuse angle.

In the figure, the transmission parts Tx and the reception parts Rx are shown as being arranged in the horizontal direction and the vertical direction, respectively. However, the present invention is not limited thereto. The transmission parts Tx and the reception parts Rx may be arranged in the state of being inclined at a predetermined angle relative to the horizontal direction. Alternatively, the transmission parts Tx and the reception parts Rx may be arranged in the vertical direction and the horizontal direction, respectively.

The first touch wires 120 included in the transmission parts Tx and the second touch wires 130 included in the reception parts Rx may be metals disposed on the same layer. In this case, in intersection areas at which the X direction, in which the transmission parts Tx are arranged, and the Y direction, in which the reception parts Rx are arranged, one of the first and second touch wires 120 and 130 extends so as to pass through the intersection areas and the other is electrically spaced apart from the one of the first and second touch wires through bridge electrodes 140 formed on a different layer in order to prevent an electrical short between the first and second touch wires 120 and 130. As shown, connection electrodes 120a, which are formed with the first wires 121 included in the transmission parts Tx, are provided in the intersection areas from adjacent transmission parts Tx so as to interconnect the adjacent transmission parts Tx, and the bridge electrodes 140 are provided on the different layer so as to intersect the connection electrodes 120a, whereby the bridge electrodes 140 are connected to the third wires 131 or the fourth wires 132 of adjacent reception parts Rx. As shown, a plurality of connection electrodes 120a may be spaced apart from each other in the same direction in a corresponding intersection area, although each connection electrode 120a may be a single member in a corresponding intersection area. The connection electrodes 120a are connected to the first touch wires 120 of the transmission parts Tx of adjacent blocks.

In another embodiment, in the case in which the first touch wires 120 and the second touch wires 130 constituting the transmission parts Tx and the reception parts Rx are metals formed on different layers, the first touch wires 120 and the second touch wires 130 may extend through the intersection areas without bridge electrodes provided on an additional layer in order to interconnect adjacent transmission parts Tx and to interconnect adjacent reception parts Rx.

The reason that the first touch wires 120 and the second touch wires 130, which are arranged in the form of a mesh, are provided on the transmission parts Tx and the reception parts Rx of the touch panel is that it is necessary to improve the sensitivity of signal transmission and signal detection using low-resistance metal without RC delay, to prevent the metal wires from being visible on a screen on which an image is displayed by dividing the metal wires, and to disperse stress due to folding or bending when used in a flexible organic light-emitting display device.

The metal constituting the first touch wires 120 and the second touch wires 130 may be low-resistance metal. For example, the first touch wires 120 and the second touch wires 130 may be formed of one selected from among gold (Au), silver (Ag), palladium (Pd), copper (Cu), aluminum (Al), chrome (Cr), molybdenum (Mo), and titanium (Ti), or a metal stack or an alloy including at least one selected from among these. In an example of the metal stack, the first touch wires 120 and the second touch wires 130 may be formed of an Ag—Pd—Cu alloy (APC) or a Mo—Al—Mo alloy. However, the metals constituting the first and second touch wires 120 and 130 are not limited to the above-specified examples. The first and second touch wires 120 and 130 may be formed of other different low-resistance metals, alloys including the low-resistance metals, or stacks including the low-resistance metals.

Signals are sequentially transmitted through respective columns of the transmission parts Tx, and signals are detected through respective rows of the reception parts Rx.

When a touch occurs, a detected signal is changed, which is detected to determine whether the touch has occurred.

The touch panel of the present disclosure has a touch electrode array of the first touch wires 120 and the second touch wires 130 on the first substrate 100, which is flexible. The touch panel is laminated with an organic light-emitting array to perform a coordinate input and detection function when the organic light-emitting display device is driven.

The first substrate 100 may be a plastic, thin glass, or metal substrate. A first inorganic buffer layer is provided on the surface of the first substrate 100 in order to smooth the surface on which the first touch wires 120 and the second touch wires 130 are formed. In addition, it is possible to protect the touch electrode array when a sacrificial layer or a glass board under the first substrate 100 is removed in order to make the first substrate 100 flexible.

The first substrate 100 is provided at the middle thereof with a touch area TA including pluralities of transmission parts Tx and reception parts Rx, which are arranged in a matrix fashion, and is provided at the outer edge thereof with a dead area DA. A touch pad unit 170 is provided at a portion of the dead area DA. In addition, the first substrate 100 has routing wires 150a and 150b for connecting ends of the transmission parts Tx and reception parts Rx to the touch pad unit 170. The routing wires 150a and 150b may be wires formed on the same layer as the first and second touch wires 120 and 130 or wires formed on the same layer as the bridge electrodes 140.

The dead area DA corresponds to the outside of the touch area. Specifically, the dead area DA corresponds to partial widths of the upper, lower, left, and right sides of the first substrate 100. The portion of the dead area where the touch pad unit 170 is located may have a relatively large area.

In the figure, two touch pad units 170 are shown as being provided at opposite sides of the upper side of the first substrate 100. However, the present invention is not limited thereto. The touch pad unit 170 has therein a plurality of touch pads 160a and 160b, which are connected to the routing wires 150a and 150b, which are connected to the transmission parts Tx and the reception parts Rx.

In the organic light-emitting display device of the present disclosure, the touch pad unit is connected to a dummy pad unit (not shown) of the organic light-emitting array/thin-film transistor (TFT) array via an anisotropic conductive film when the organic light-emitting array is laminated with the touch electrode array.

Figure 2:
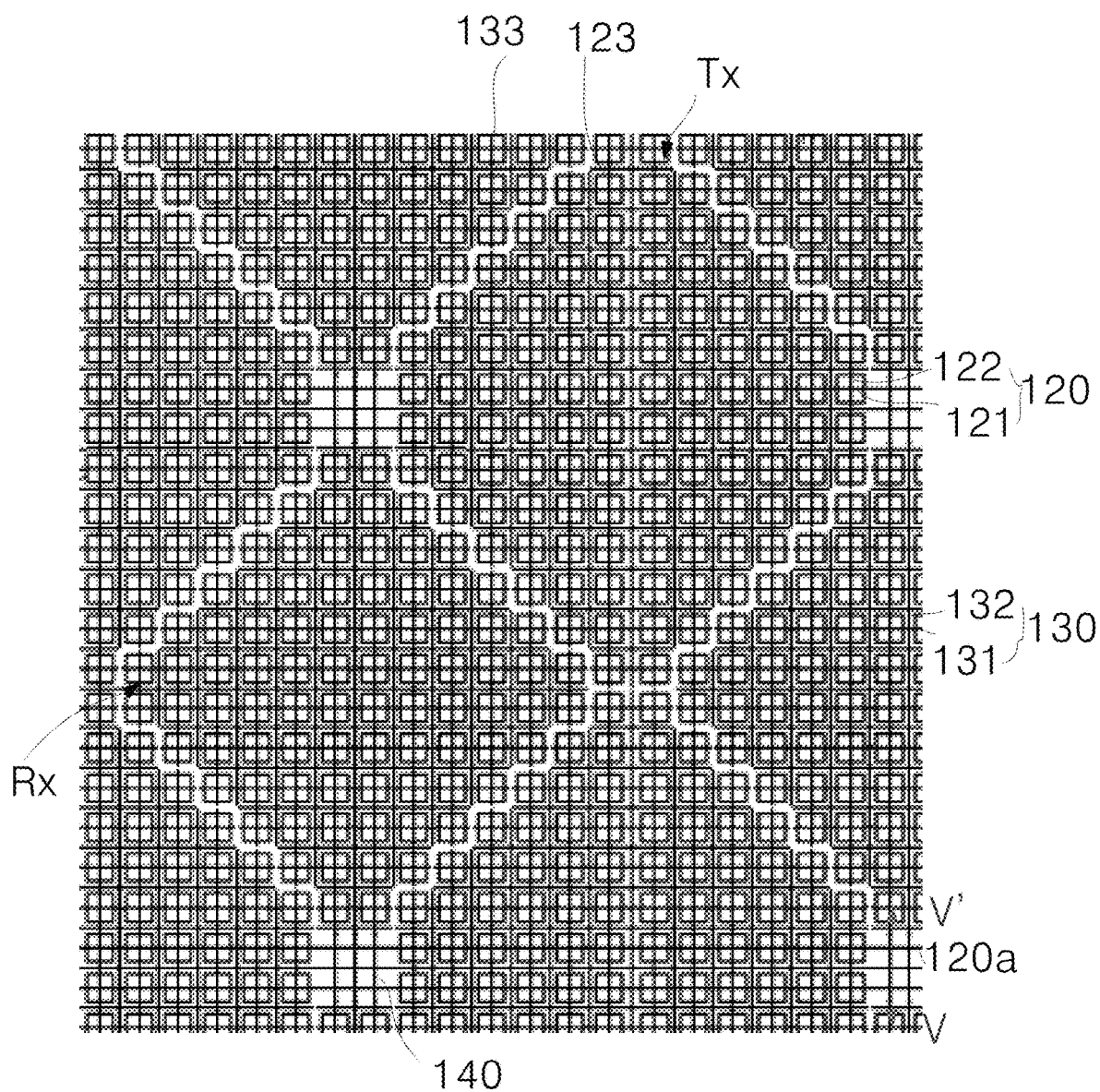
FIG. 2 is a plan view showing area A of FIG. 1A according to a second form of the touch panel, according to one embodiment.

FIG. 2 is a plan view showing area A of FIG. 1A according to a second form of the touch panel.

As shown in FIG. 2, the touch panel according to the second form, which is configured to improve the touch sensitivity of the touch panel, includes first and second island-shaped transparent conductive layers 123 and 133. The first and second transparent conductive layers 123 and 133 are provided in the intersections in the first and second directions and the intersections in the third and fourth directions of the touch wires 120 and 130 in the respective blocks of the transmission parts Tx and reception parts Rx. The first and second island-shaped transparent conductive layers 123 and 133 are electrically connected to the touch wires.

The first and second transparent conductive layers 123 and 133 are made of indium tin oxide (ITO), indium zinc oxide (IZO), or indium gallium zinc oxide (IGZO).

The first and second touch wires 120 and 130 are made of low-resistance metal, whereby line resistance and RC delay are reduced. In the case in which the touch wires are provided only in the area in which touch is actually performed, however, the area occupied by the touch wires is small, with the result that the change in amount of electric charge of a touch object in the touch region is small, whereby it may be difficult to detect whether a touch has been performed. The reason that the first and second transparent conductive layers 123 and 133 are provided is improve the detection of the change of capacitance caused by the touch object (e.g. a finger or a pen) by increasing the area of the electrode in the touch panel, since the width of the first and second touch wires 120 and 130 is small. That is, the transparent conductive layers are configured such that the transparent conductive layers have horizontal and vertical widths greater than the width of the touch wires so as to sufficiently cover the intersections of the touch wires. The shown first and second touch wires 120 and 130 are formed in a quadrangular shape. However, the present invention is not limited thereto. The first and second touch wires 120 and 130 may be formed in other polygonal shapes.

When a user touches the touch panel with his/her finger or a touch pen, therefore, a signal detected by the reception parts Rx is changed by the capacitance generated between the finger and the second touch wires 130 in the reception parts Rx and the second transparent conductive layer 133, whereby it is possible to stably detect whether a touch has been performed.

The touch panel of the second form may be identical in construction to the touch panel of the first form shown in FIG. 1, except that the transparent conductive layers are provided.

The island-shaped transparent conductive layers 123 and 133 may be referred to as segment electrodes, since the island-shaped transparent conductive layers 123 and 133 are separated from each other when viewed in a plan view.

In the first and second forms, the first and second touch wires 120 and 130 are arranged in the first and second directions, which are different from each other, and in the third and fourth directions, which are different from each other. That is, the wires are arranged in two directions in the transmission parts Tx and reception parts Rx. Alternatively, the wires may be arranged in a third direction or other directions between the first direction and the second direction.

The above description is directed to the touch panel having the touch wires arranged in the metal mesh shape. The touch wires in the touch panel are made of shielding metal. For this reason, when the touch panel is applied to a display device such as an organic light-emitting display device, the touch wires may be visible if the touch wires are disposed over a predetermined area of the organic light-emitting array.

The organic light-emitting display device of the present disclosure is configured such that when the touch panel having the touch wires arranged in the metal mesh shape is provided at the organic light-emitting array, the touch wires are prevented from being visible by adjusting the disposition between the touch wires and sub-pixels of the organic light-emitting array and such that misalignment between touch panels manufactured in different manufacturing lines and the organic light-emitting array is reduced. In addition, the organic light-emitting display device of the present disclosure is configured such that the touch wires are prevented from being visible even when the viewing angle is changed, i.e. even when the organic light-emitting display device is not viewed from the front.

First Embodiment

Figure 3A:
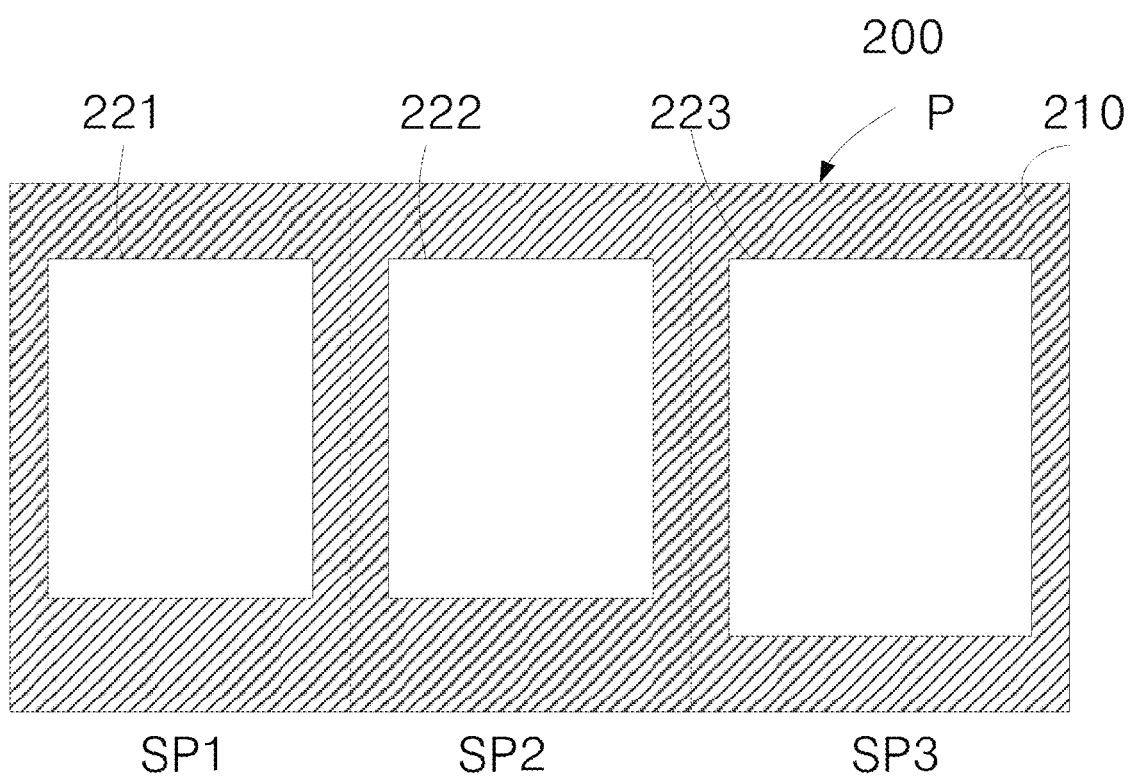
FIG. 3A is a plan view showing one pixel of an organic light-emitting array of an organic light-emitting display device according to a first embodiment.
Figure 3B:
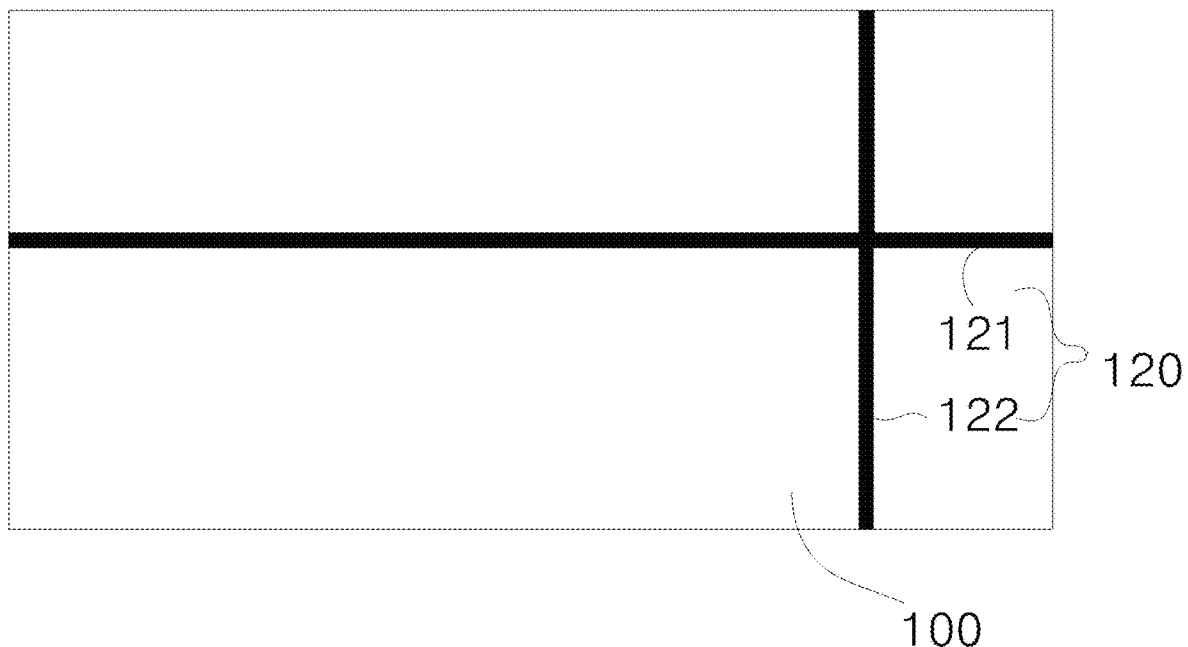
FIG. 3B is a plan view showing an area of the touch panel corresponding to FIG. 3A.
Figure 3C:
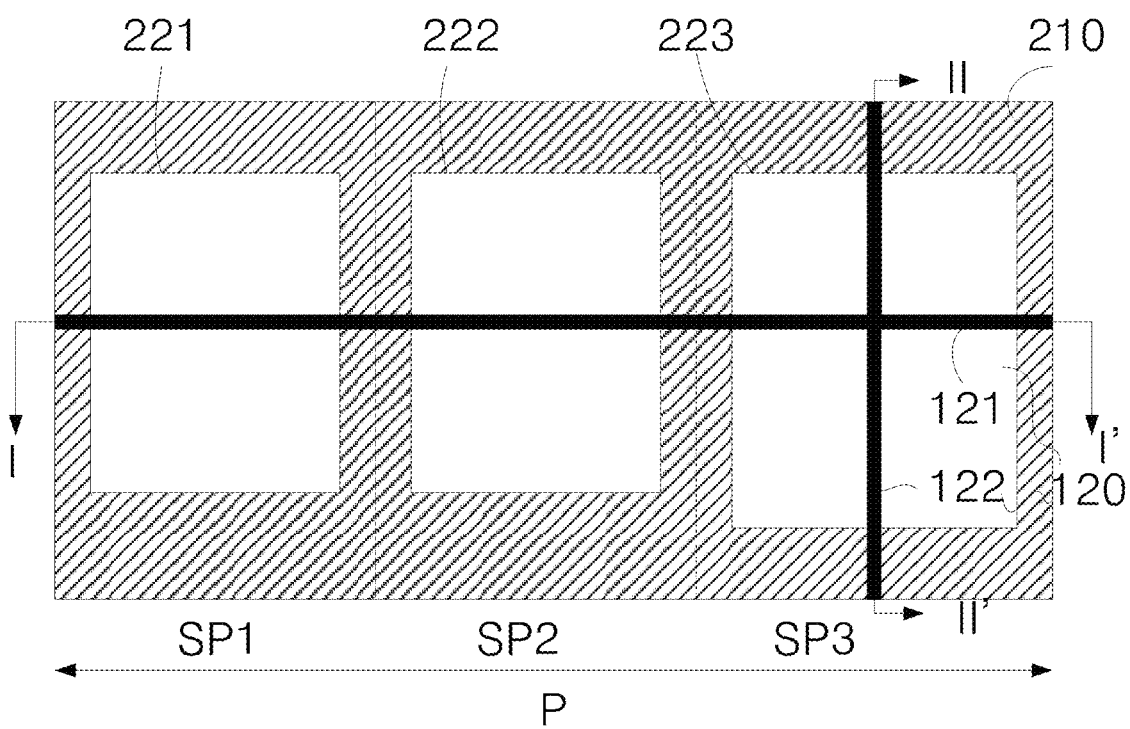
FIG. 3C is a plan view showing the state in which the touch panel and the organic light-emitting array of the organic light-emitting display device are laminated.
Figure 4A:
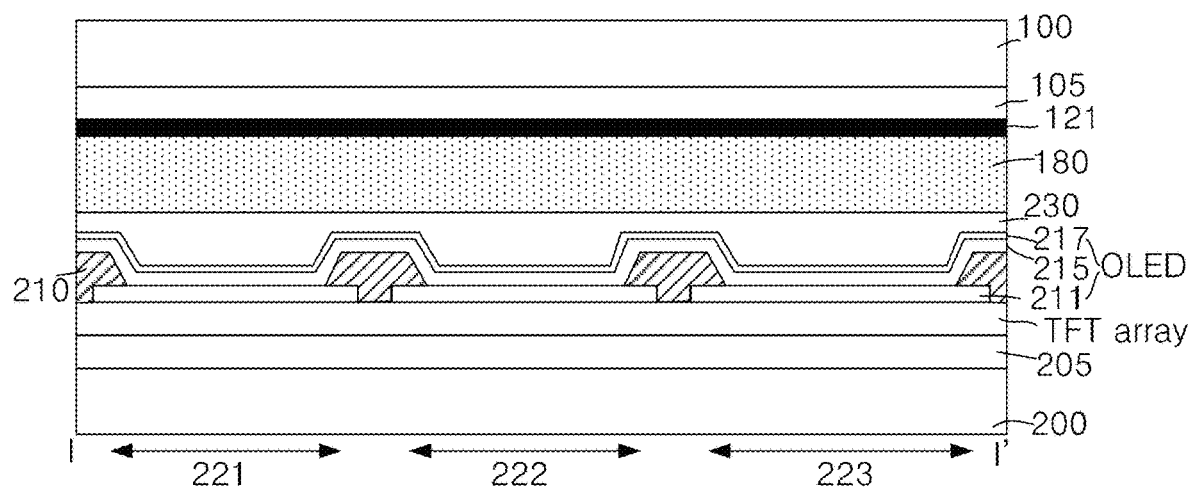
FIGS. 4A and 4B are sectional views taken along lines I-I' and II-II' of FIG. 3C, respectively.
Figure 4B:
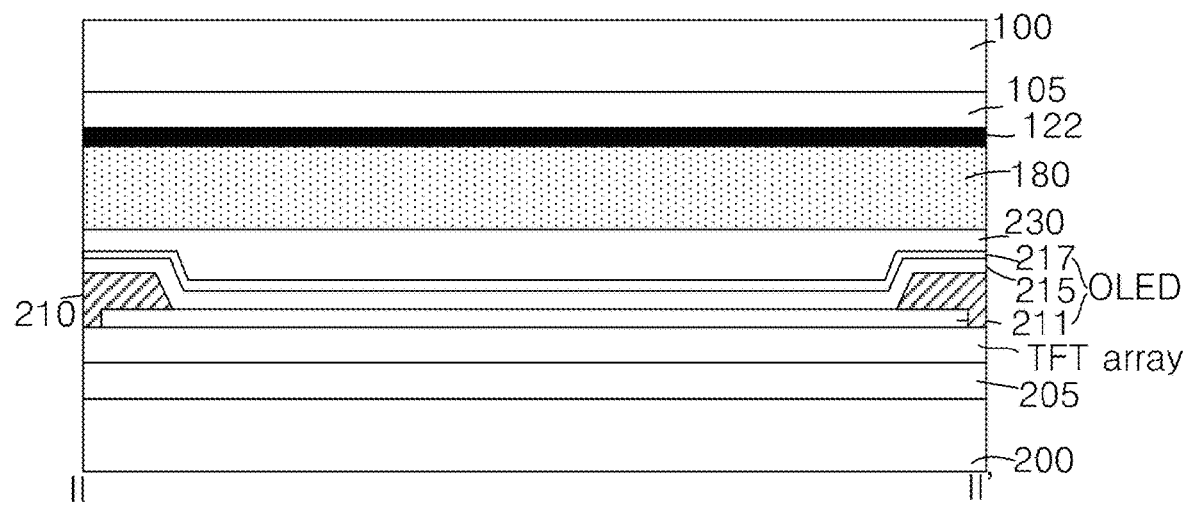

FIG. 3A is a plan view showing one pixel of an organic light-emitting array of an organic light-emitting display device according to a first embodiment, FIG. 3B is a plan view showing an area of the touch panel corresponding to FIG. 3A, and FIG. 3C is a plan view showing the state in which the touch panel and the organic light-emitting array of the organic light-emitting display device are laminated. FIGS. 4A and 4B are sectional views taken along lines I-I' and II-II' of FIG. 3C, respectively.

As shown in FIG. 3A, the organic light-emitting array is configured such that a plurality of pixel area P is arranged on a second substrate 200 in a matrix fashion. Each pixel area P includes at least three sub-pixels SP1, SP2, and SP3. The sub-pixels SP1, SP2, and SP3 in each pixel area P may emit different colors, or two or more sub-pixels in each pixel area P may emit the same color. For example, in the case in which each pixel area includes three sub-pixels, the sub-pixels may emit red color, green color, and blue color. In the case in which each pixel area includes four sub-pixels, the sub-pixels may emit a red color, a green color, a blue color, and a white color. Alternatively, sub-pixels that emit a red color, a green color, and a blue color may be provided, and another sub-pixel that emits the same color as one of the sub-pixels that emit the red color, the green color, and the blue color may be further provided. The sub-pixels may be disposed in each pixel area in a stripe pattern, as shown in FIG. 3A. Alternatively, the sub-pixels may be disposed in a mosaic or diamond pattern.

The organic light-emitting array may include a pixel circuit unit including two or more thin film transistors and one or more capacitors for driving the sub-pixels SP1, SP2, and SP3 in a circuit fashion and organic light-emitting diodes connected to the pixel circuit unit. Each of the organic light-emitting diodes includes a first electrode 211 assigned to each sub-pixel and an organic light-emitting layer 215 and a second electrode 217 located above the first electrode 211.

Light-emitting parts 221, 222, and 223 are defined in the portions of the sub-pixels SP1, SP2, and SP3 at which the organic light-emitting diodes (OLEDs) are located, and banks 210 having openings corresponding to the light-emitting parts 221, 222, and 223 are located around the light-emitting parts 221, 222, and 223. The banks 210 have a predetermined height in order to distinguish between the light-emitting parts 221, 222, and 223 of the sub-pixels SP1, SP2, and SP3. The banks 210 include an organic material that can be patterned so as to have a predetermined height. For example, the banks 210 may include a polyimide or a photoresist. In addition, the banks 210 may further include an inorganic material, such as an oxide film or a nitride film.

The banks 210 may be formed in the entire pixel areas between the light-emitting parts. Alternatively, the banks 210 may be separated between the light-emitting parts 221, 222, and 223 as needed. In another alternative, spacers that have slits partially formed between the light-emitting parts or that are stacked on the light-emitting parts may be further included.

However, the organic light-emitting display device of the present invention is not limited to the structure including the banks 210. The organic light-emitting display device is applicable to a configuration in which a bankless structure defines the light-emitting parts without using the banks 210. For example, in a bankless organic light-emitting display device, the light-emitting parts may be defined in first electrode-forming portions of the organic light-emitting diodes provided in the respective sub-pixels.

At least one of the light-emitting parts defined in the respective sub-pixels SP1, SP2, and SP3 may have a different area than the other. As shown in FIGS. 3B and 3C, an intersection at which the first wire 121, extending in the first direction of the first touch wire 120, and the second wire 122, extending in the second direction thereof, intersect each other corresponds to the sub-pixel SP3 having the largest area. In FIGS. 3A to 4B, only the first touch wires 120 are shown for the sake of convenience. For the second touch wires 130 in the reception parts Rx, which intersect the transmission parts Tx, as well as the first touch wires 120 in the transmission parts Tx, however, the intersection of the touch wires corresponds to the sub-pixel having the largest area.

The difference in area between the light-emitting parts may be set based on the efficiency of organic light-emitting layers provided in the organic light-emitting diodes. A sub-pixel having a light emission color exhibiting relatively low efficiency may have a light-emitting part having a relatively large sub-pixel.

The sub-pixel SP3 having the largest light-emitting part may emit the same color in the pixel areas.

As described above, the organic light-emitting display device according to the first embodiment of the present disclosure is configured such that the intersections of the first touch wires 120 or the intersections of the second touch wires 130 correspond to the sub-pixels SP3 having the largest light-emitting part by adjusting the alignment between the sub-pixels of the organic light-emitting array and the first and second touch wires 120 and 130 of the touch panel.

In this case, the largest light-emitting parts correspond to the intersections of the first touch wires 120 or the intersections of the second touch wires 130, whereby the first touch wires 120 or the second touch wires 130 are oriented in two different directions. Since the intersection of the first touch wires 120 is located in the relatively large light-emitting part 223, the proportion of the touch wires 120 in the light-emitting part is less than in the case in which the intersection of the first touch wires 120 is located in the relatively small light-emitting part 221 or 222, whereby it is possible to prevent the touch wires 120 from being visible. Here, the first wire 121 and the second wire 122 have the same width.

As shown in FIG. 3C, the light-emitting parts of the sub-pixels SP1 and SP2, where the largest light-emitting part 223 is not located, may correspond to any one of the first wire 121 extending in the first direction of the touch wire 120 and the second wire 122 extending in the second direction thereof. In this case, the sub-pixels SP1 and SP2, where the largest light-emitting part 223 is not located, have only a touch wire 120 extending in one direction. As a result, the touch wire 120 having the area smaller than that of the touch wire 120 in the sub-pixel SP3 having the largest light-emitting part 223, where the touch wire 120 extends in two directions, is located in the sub-pixels SP1 and SP2, where the largest light-emitting part 223 is not located. As a result, the area of the touch wire 120 in the sub-pixels SP1 and SP2 is smaller than that of the touch wire 120 in the sub-pixel SP3 having the largest light-emitting part 223.

The organic light-emitting display device according to the first embodiment is configured such that the touch wire 120 is regularly provided in each pixel area, which has sub-pixels SP1, SP2, and SP3 defining light-emitting parts 221, 222, and 223 having different areas, the intersection of the touch wire 120 is provided in only the sub-pixel SP3 that has the largest light-emitting part, and the touch wire 120 is disposed in the other sub-pixels SP1 and SP2 only in one direction, whereby the ratio of the area of the touch wire 120 to that of each light-emitting part is reduced to a predetermined level or less.

Specifically, the sectional structure of the organic light-emitting display device according to the first embodiment will be described with reference to FIGS. 4A and 4B.

The first substrate 100 and the second substrate 200 may be made of a ductile material. The first substrate 100 and the second substrate 200 may be a plastic, thin glass, or metal substrate. A first inorganic buffer layer 105 and a second inorganic buffer layer 205 are provided on the surfaces of the first substrate 100 and the second substrate 200, respectively, to smooth the surfaces on which the first and second touch wires 120 and 130 are formed or the surface on which a TFT array is formed. In addition, it is possible to protect the touch electrode array and the TFT array when sacrificial layers or glass boards under the first substrate 100 and the second substrate 200 are removed in order to make the first substrate 100 and the second substrate 200 flexible.

Each of the first and second inorganic buffer layers 105 and 205 may include a plurality of inorganic layers. Each of the inorganic layers may include an oxide film, a nitride film, or an oxide-nitride film.

The TFT array is configured to correspond to the pixel circuit unit provided in each pixel area. The TFT array may be a thin film transistor or a capacitor. The formation of the thin film transistor will be described in detail below.

An organic light-emitting diode (OLED) is connected to one electrode of the thin film transistor. The organic light-emitting diode includes a first electrode 211 assigned to each sub-pixel, an organic light-emitting layer 215 provided on the first electrode 211, and a second electrode 217 located on the organic light-emitting layer 215.

Between the organic light-emitting layer 215 and the first electrode 211 may be further provided a first common layer and a second common layer, made of an organic material, having an electric charge transfer function.

The organic light-emitting layer 215 and the first and second common layers may be formed between the sub-pixels without being divided such that all of the sub-pixels emit a white color. Alternatively, at least the organic light-emitting layer 215 may be assigned to each sub-pixel such that the sub-pixels emit different colors. In the former case, a color filter layer (not shown) may be further provided on the first substrate 100 to emit a red color, a green color, and a blue color.

An encapsulation layer 230 for protecting the organic light-emitting diodes (OLEDs) from external moisture or external air is provided on the second electrode 217. The encapsulation layer 230 is configured such that inorganic layers and organic layers are alternately stacked. The encapsulation layer 230 covers at least the upper surfaces and the side surfaces of the sub-pixels to prevent moisture from permeating through the side surface of the sub-pixels.

The second substrate 200, including the TFT array and the organic light-emitting diodes (OLEDs) connected to the thin film transistors of the respective sub-pixels of the TFT array, and the first substrate 100, having the first and second touch wires 120 and 130, are disposed such that organic light-emitting diodes face the first and second touch wires 120 and 130. The first substrate 100 and the second substrate 200 are laminated in the state in which an adhesive layer 180 is disposed therebetween. During lamination, the touch pad unit of FIG. 1A is electrically connected to a dummy pad unit on the second substrate 200.

Second Embodiment

Figure 5:
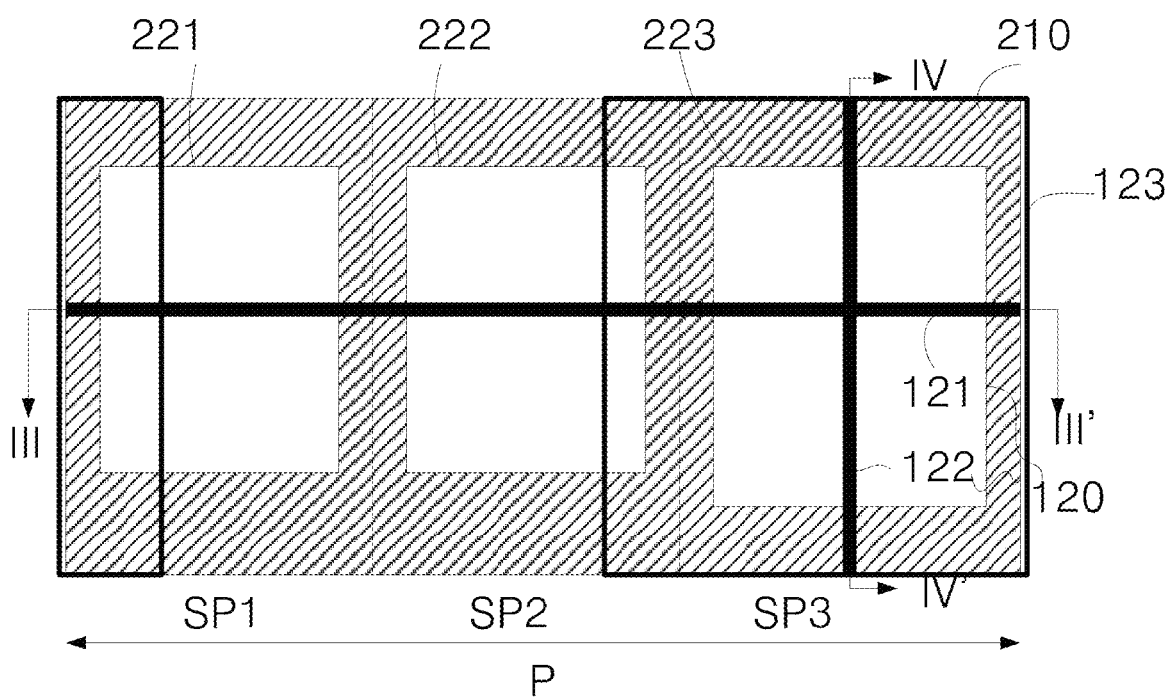
FIG. 5 is a plan view showing an organic light-emitting display device according to a second embodiment.
Figure 6:
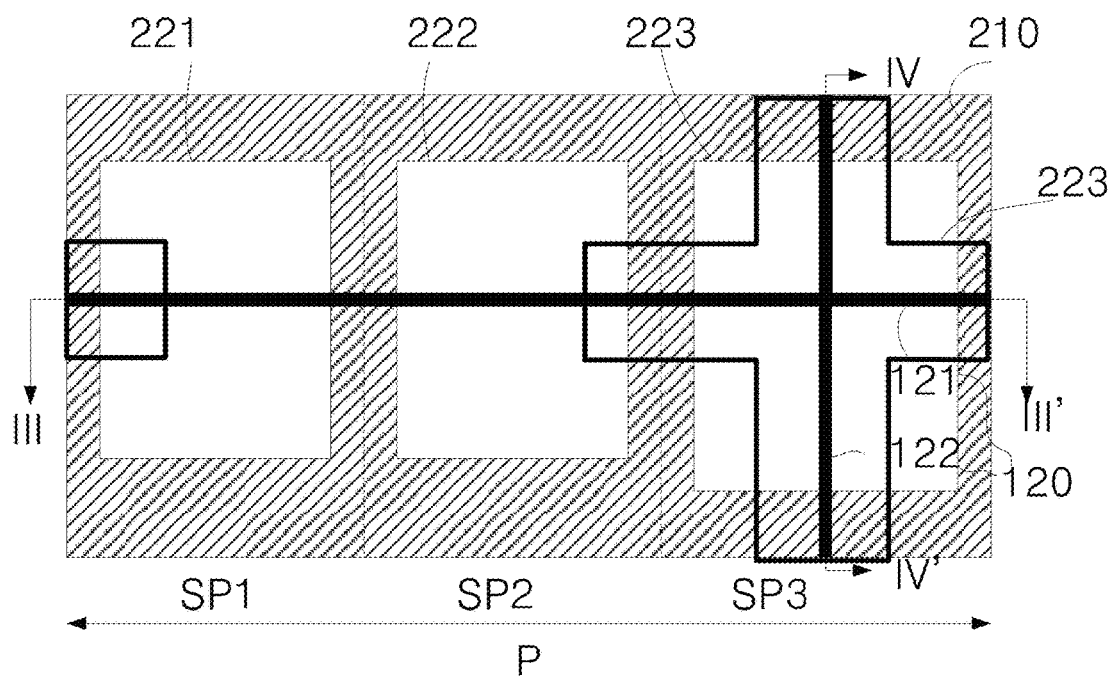
FIG. 6 is a plan view showing an organic light-emitting display device according to a modification of the second embodiment.
Figure 7A:
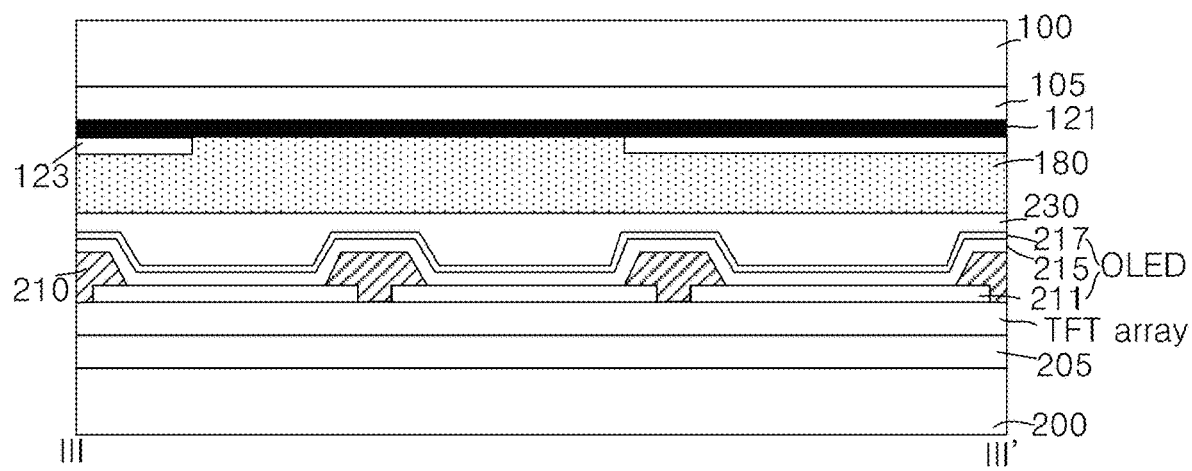
FIGS. 7A and 7B are sectional views taken along lines III-III' and IV-IV' of FIG. 5 or 6, respectively.
Figure 7B:
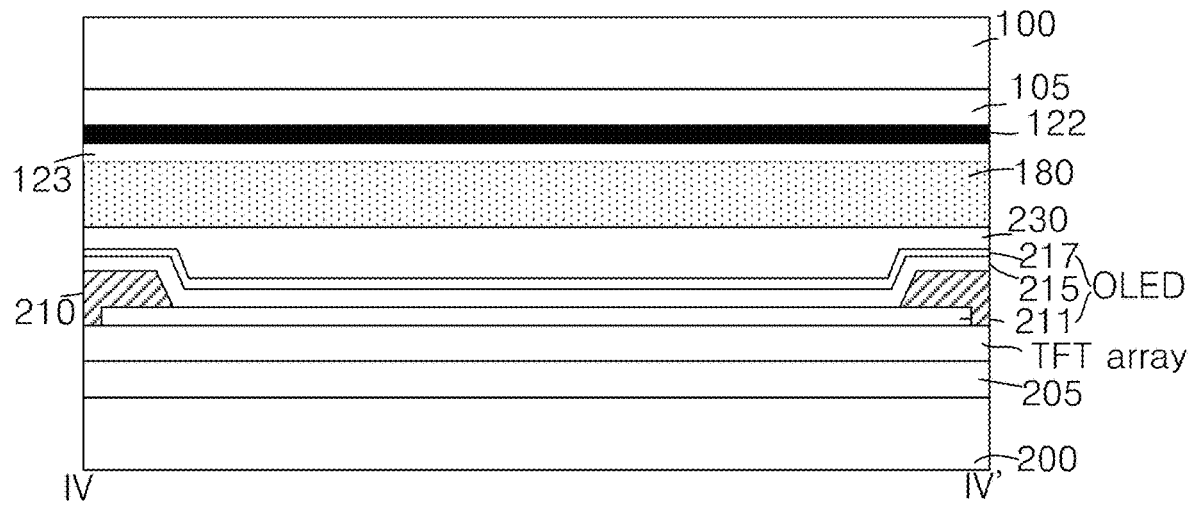

FIG. 5 is a plan view showing an organic light-emitting display device according to a second embodiment, and FIG. 6 is a plan view showing an organic light-emitting display device according to a modification of the second embodiment. FIGS. 7A and 7B are sectional views taken along lines III-III' and IV-IV' of FIG. 5 or 6, respectively.

As shown in FIGS. 5, 7A, and 7B, the organic light-emitting display device according to the second embodiment is configured by applying the structure of the touch panel according to the second form shown in FIG. 2 to the organic light-emitting display device. In a touch panel, a first island-shaped transparent conductive layer 123 is located so as to correspond to an intersection of a first wire 121 extending in a first direction and a second wire 122 extending in a second direction, which is different from the first direction.

In the figures, only the first transparent conductive layer 123 is shown for the sake of convenience. In the same manner, a second transparent conductive layer 133 (see FIG. 2) is located so as to correspond to an intersection of a third wire 131 extending in a third direction and a fourth wire 132 extending in a fourth direction.

In the modification of the second embodiment shown in FIG. 6, a transparent conductive layer 223 is formed in a cross shape based on the shape of the intersection of the touch wires 120 and 130, whereas the transparent conductive layer 123 is formed in a quadrangular shape in FIG. 5. That is, the line-shaped transparent conductive layer 223 has a width that is a predetermined times the width of the first and second wires 121 and 122 extending in the first and second directions of the touch wires 120 and 130. The reason that the transparent conductive layer 223 is formed in a cross shape is because the touch wires intersect in two directions. However, the present invention is not limited thereto. In the case in which the touch wires have a metal mesh structure in which the touch wires intersect in three or more directions, the transparent conductive layer 223 may be formed in a shape intersecting in six or more directions at the intersections of the touch wires.

Specifically, the sectional structure of the organic light-emitting display device according to the second embodiment will be described with reference to FIGS. 7A and 7B. The structures shown in FIGS. 7A and 7B are similar to the structures shown in FIGS. 4A and 4B with the addition of the transparent conductive layer 123.

Figure 8:
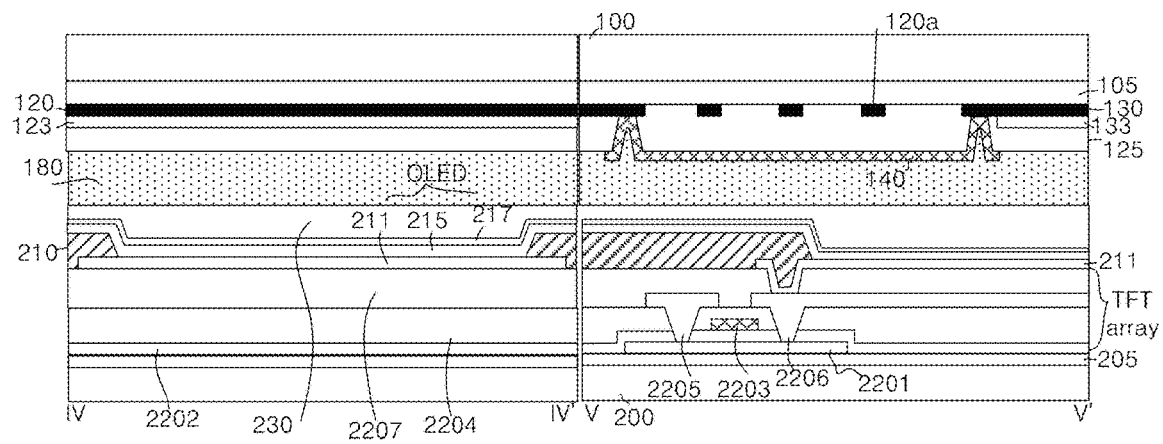
FIG. 8 is a sectional view showing in detail a transmission part (IV-IV') of FIG. 6 and a bridge electrode region (V-V') of FIG. 2 in the organic light-emitting display device, according to one embodiment.

FIG. 8 is a sectional view showing in detail a transmission part (IV-IV') of FIG. 6 and a bridge electrode region (V-V') of FIG. 2 in the organic light-emitting display device of the present invention.

FIG. 8 shows the construction of the first touch wire 120, the second touch wire 130, and the bridge electrode 140 in the area of the intersection of the transmission part Tx and the reception part Rx, through which the bridge electrode extends. FIG. 8 also shows the construction of the TFT array connected to the organic light-emitting diode (OLED). The structure including the bridge electrode 140 may further include an interlayer dielectric film 125 between the first and second touch wires 120 and 130 and the bridge electrode 140.

In the case in which the first touch wire 120 of the transmission part Tx and the second touch wire 130 of the reception part Rx are disposed on the same layer, as shown in FIG. 8, a contact hole is provided in the interlayer dielectric film 125 so as to electrically connect the second touch wires 130 spaced apart from each other in the blocks of adjacent reception parts Rx, and therefore the first bridge electrode 140 is provided in the contact hole and on the interlayer dielectric film 125 at the intersection. At the intersection of the transmission part Tx and the reception part Rx, a connection electrode integrally formed with the first touch wire 120 is located in the direction intersecting the bridge electrode 140 to interconnect the transmission parts Tx of adjacent blocks.

In addition, as shown, the first and second touch wires 120 and 130 may be formed closer to the first substrate than the bridge electrode 140. Alternatively, the bridge electrode 140 and the first and second touch wires 120 and 130 may be inverted about the interlayer dielectric film 125 such that the bridge electrode 140 is formed on the first inorganic buffer layer 105.

In addition, the TFT array on the second substrate 200 is configured such that a thin film transistor, including a semiconductor layer 2201 on the second inorganic buffer layer 205, a gate electrode 2203 located on a gate dielectric film 2202 formed on the semiconductor layer 2201, and a source electrode 2205 and a drain electrode 2206 connected to opposite sides of the semiconductor layer 2201, is provided in each sub-pixel. The drain electrode 2206 is connected to the first electrode 211 of the organic light-emitting diode (OLED).

An interlayer dielectric film 2204 is provided between the gate electrode 2203 and the source electrode 2205 and the drain electrode 2206. A passivation film 2207 is provided between the source electrode 2205 and the drain electrode 2206 and the first electrode 211.

The TFT array includes all constructions from the semiconductor layer 2201 on the second inorganic buffer layer 205 to the passivation film 2207 under the first electrode 211.

Each thin film transistor included in the TFT array may be formed in the form of a bottom gate as well as the form of a top gate, as shown. The semiconductor layer constituting each thin film transistor may be made of poly silicon, amorphous silicon, or IGZO. However, the present invention is not limited thereto.

Third Embodiment

Figure 9:
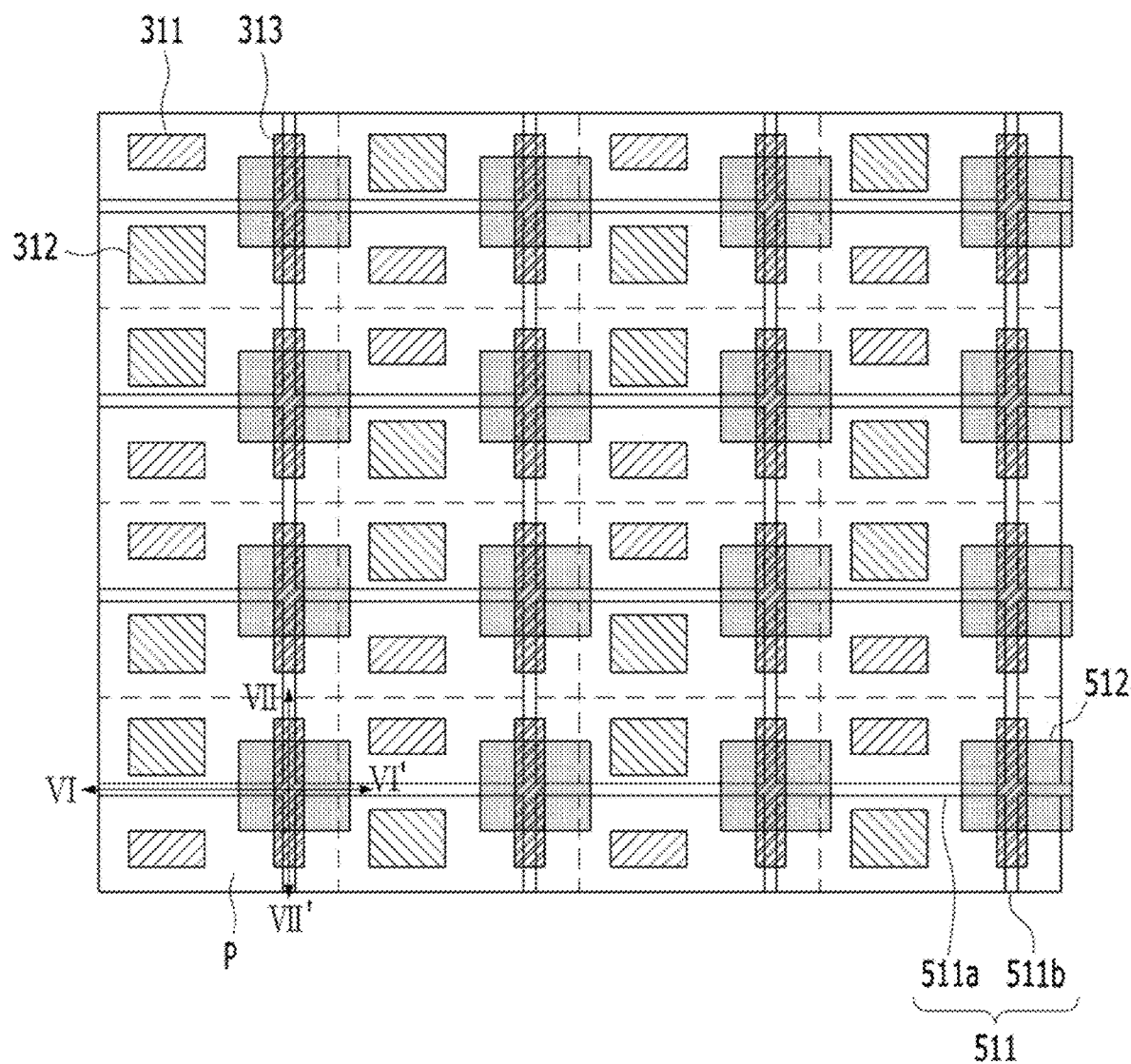
FIG. 9 is a plan view showing an organic light-emitting display device according to a third embodiment.
Figure 10A:
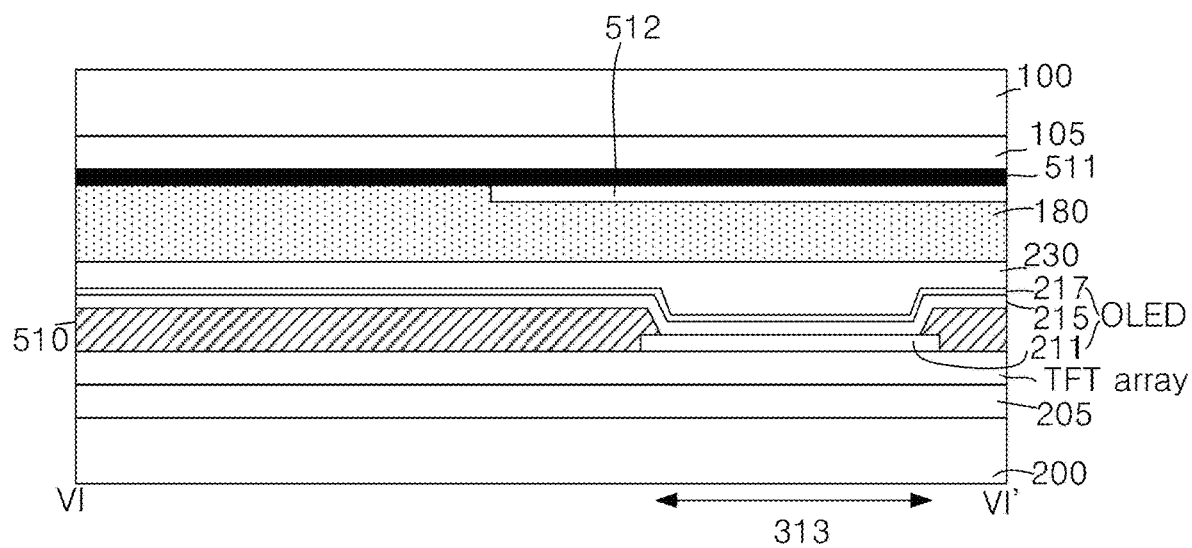
FIGS. 10A and 10B are sectional views taken along lines VI-VI' and VII-VII' of FIG. 9, respectively.
Figure 10B:

FIG. 9 is a plan view showing an organic light-emitting display device according to a third embodiment, and FIGS. 10A and 10B are sectional views taken along lines VI-VI' and VII-VII' of FIG. 9, respectively.

As shown in FIGS. 9 to 10B, the organic light-emitting display device according to the third embodiment is configured such that, in an organic light-emitting array of each pixel area, first and second sub-pixels SP1 and SP2 are arranged in a column and a third sub-pixel SP3 and the first and second sub-pixels SP1 and SP2 are arranged in a row.

In this case, a touch wire 511 is configured such that a first wire 511a extending in the first direction and a second wire 511b extending in the second direction intersect each other, and an intersection of the first wire 511a extending in the first direction and the second wire 511b extending in the second direction is located in the third sub-pixel SP3, which has the largest light-emitting part 313.

In this case, the other sub-pixels SP1 and SP2, which do not have the largest light-emitting part 313, are configured such that the touch wire 511 is not located in light-emitting parts 311 and 312 but is located in the outsides of the light-emitting parts 311 and 312, i.e. banks 510.

The other sub-pixels SP1 and SP2, which do not have the largest light-emitting part 313, may have different areas, as shown in FIG. 9. The difference in area between the sub-pixels SP1 and SP2 may be set based on the efficiency of an organic light-emitting diode of each sub-pixel.

Even in this structure, the ratio of the area of the touch wire 511 to that of the light-emitting part of the sub-pixel SP3 having the largest light-emitting part 313 is reduced to a predetermined level or less, thereby preventing the touch wire from being visible.

In the shown structure, the light-emitting parts 311, 312, and 313 emit a green color, a red color, and a blue color, respectively. In pixel areas horizontally or vertically adjacent to each other, the green and red sub-pixels are inverted. Consequently, in the pixel areas that are vertically arranged, the red or green sub-pixels are adjacent to each other.

Reference numeral 512 indicates a transparent conductive layer 512 that contacts the touch wire 511 at the intersection of the first and second wires 511a and 511b extending in the first and second directions of the touch wire 511.

As previously described, the transparent conductive layer 512 is provided such that it is possible to easily detect the change of capacitance caused by a touch object (e.g. a finger or a pen) by increasing the area of the electrode in the touch panel, since the width of the touch wire 511 is small.

In the shown structure, the sub-pixels are shown as having red, green, and blue light-emitting parts. However, the present invention is not limited thereto. The sub-pixels may have different light-emitting parts as long as a white color can be expressed.

Fourth Embodiment

Figure 11:
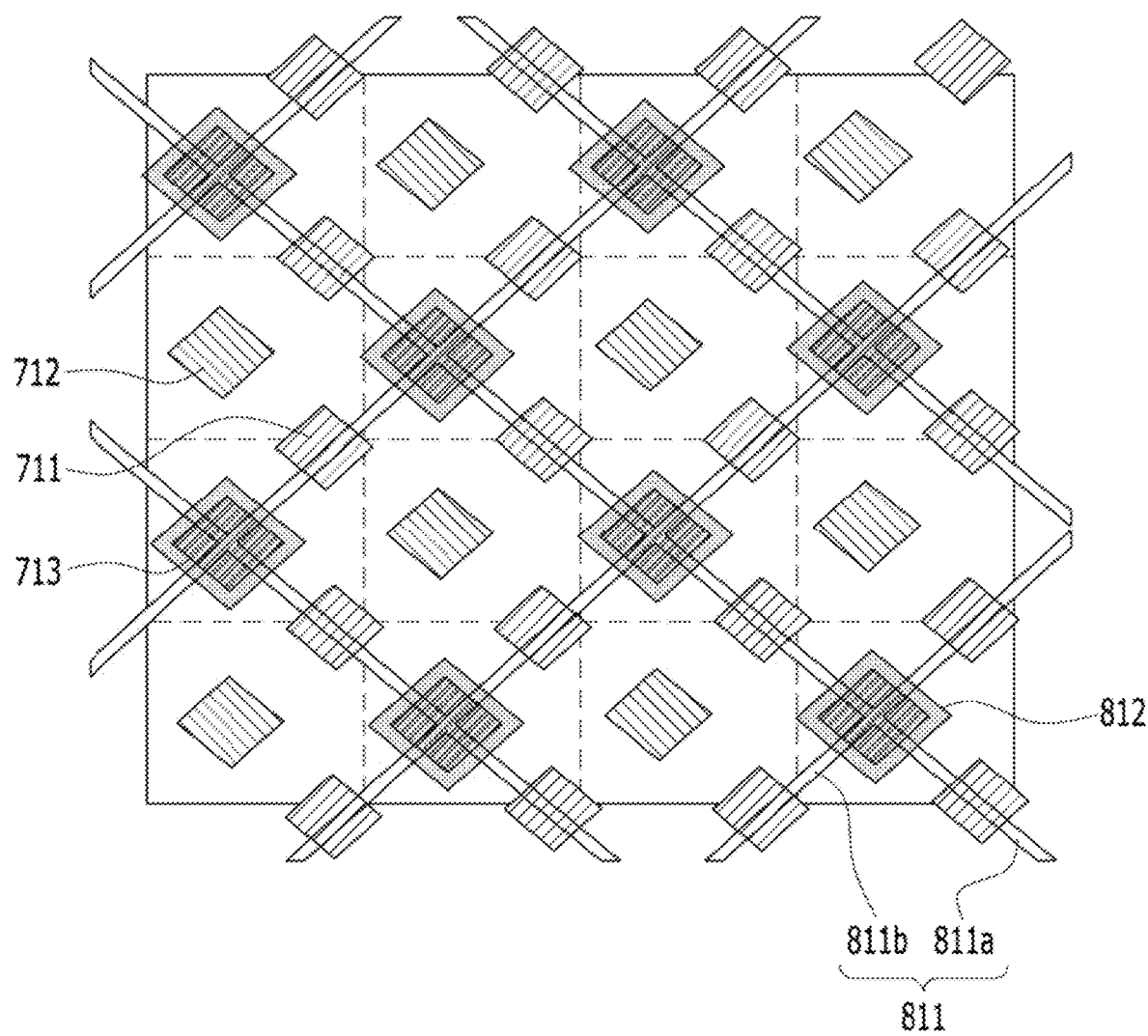
FIG. 11 is a plan view showing an organic light-emitting display device according to a fourth embodiment.

FIG. 11 is a plan view showing an organic light-emitting display device according to a fourth embodiment.

As shown in FIG. 11, the organic light-emitting display device according to the fourth embodiment is configured such that a light-emitting part 713 of a blue sub-pixel has the largest area and such that sub-pixels and a touch wire 811 are arranged obliquely. Specifically, green and blue light-emitting parts 711 and 713 are alternately arranged in the state of being spaced apart from each other along a first line at an angle of 45 degrees, and red and green light-emitting parts 712 and 713 are alternately arranged in the state of being spaced apart from each other along a second line at an angle of 45 degrees.

The touch wire 811 is configured such that a second wire 811b extends in a second direction so as to pass through the green and blue light-emitting parts 711 and 713 along the first line at an angle of 45 degrees and such that a first wire 811a extends in a first direction so as to pass through the green and blue light-emitting parts 711 and 713, which are alternately arranged at an angle of negative 45 degrees.

In this arrangement, the touch wires 811a and 811b are located in the light-emitting parts 711 of the green sub-pixels in one direction, the touch wires 811a and 811b are not located in the light-emitting parts 712 of the red sub-pixels, and the touch wires 811a and 811b are located in the light-emitting parts 713 of the blue sub-pixels in two directions such that intersections are located in the light-emitting parts 713 of the blue sub-pixels.

Consequently, the intersection of the touch wires 811 is located only in the light-emitting part 713 of the blue sub-pixel, which has the largest area, and only the touch wire 811a or 811b extending in one direction is located, or no touch wire is located, in the sub-pixels having the light-emitting parts 712 and 711, the area of which is smaller than that of the light-emitting part 713. As a result, the ratio of the area of the touch wire to that of the light-emitting parts of the sub-pixels may be reduced to a predetermined level or less. That is, the ratio of the area of the shielding wires to that of the light-emitting parts may be reduced so as to be less than a visible ratio.

Reference numeral 812 indicates a transparent conductive layer 812 that contacts the touch wire 811 at the intersection of the first and second wires 811a and 811b extending in the first and second directions of the touch wire 811.

As previously described, the transparent conductive layer 812 is provided such that it is possible to easily detect the change of capacitance caused by a touch object (e.g. a finger or a pen) by increasing the area of the electrode in the touch panel, since the width of the touch wire 811 is small.

In the shown structure, the sub-pixels are shown as having red, green, and blue light-emitting parts. However, the present invention is not limited thereto. The sub-pixels may have different light-emitting parts as long as a white color can be expressed.

Fifth Embodiment

Figure 12:
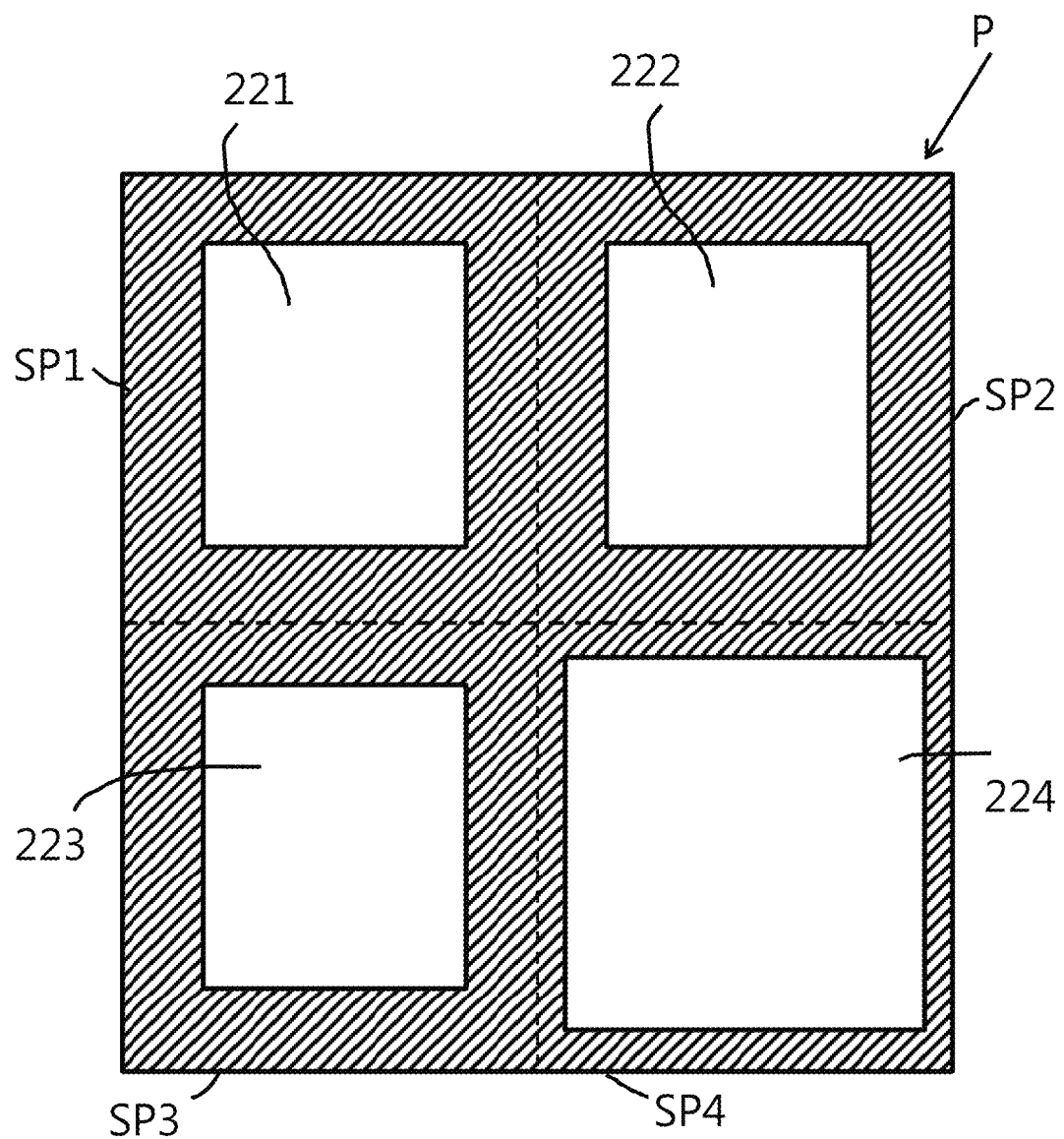
FIG. 12 is a plan view showing an organic light-emitting display device according to a fifth embodiment.

FIG. 12 is a plan view showing an organic light-emitting display device according to a fifth embodiment.

FIG. 12 shows one pixel area P of the organic light-emitting display device according to the fifth embodiment. Four sub-pixels SP1, SP2, SP3, and SP4 are included in the quadrangular pixel area P. In the organic light-emitting display device according to the fifth embodiment, an intersection of touch wires (not shown) is located in the fourth sub-pixel SP4, which has the largest light-emitting part.

In the case in which the intersection of the touch wires is located in the fourth sub-pixel SP4, which has the largest light-emitting part, the touch wire may not be located in one of the other sub-pixels SP1, SP2, and SP3, and a wire extending in one direction, which constitutes the touch wire, may be located in the remaining two sub-pixels.

In the same manner as in the previous embodiments, the intersection of the touch wires is located in the largest light-emitting part. Consequently, the ratio of the area of the touch wire to that of the light-emitting parts is reduced to a predetermined level or less, thereby preventing the touch wire from being visible.

For the sectional construction of this embodiment, reference is to be made to the constructions of the previous embodiments.

The organic light-emitting display device of the present disclosure has the following effects.

That is, the intersection of the touch wires is located in the sub-pixel having the largest light-emitting part, thereby preventing variation in the visibility of the touch wire in each area, compared to a structure in which the intersection of the touch wires is located in a bank (i.e. a non-light-emitting part). For example, in the structure in which the intersection of the touch wires is located in the bank, a portion of the touch wire is located in the light-emitting part when the touch electrode array and the organic light-emitting array are misaligned, with the result that the touch wire may be visible in the portion of a sub-pixel having a small light-emitting part on which the touch wire overlaps, which is prevented by the present embodiments. That is, the area occupied by the largest light-emitting part covers the portion in which misalignment may occur. Even in the case in which the touch electrode array and the organic light-emitting array are misaligned, therefore, there is no variation in the overlapping area between the touch wire in each area and the light-emitting part, since the touch wire of the touch electrode array is located in the largest light-emitting part, thereby preventing variation in visibility.

In addition, the touch wire is located in the light-emitting parts, rather than in the banks. Consequently, it is possible to effectively prevent the touch wire from being visible in a high-resolution structure in which the width of the banks is reduced.

In addition, a color viewing angle is improved. In the structure in which the touch wire is located in the banks, colors emitted by adjacent sub-pixels are affected by each other when the viewing angle is changed, i.e. when the organic light-emitting display device is not viewed from the front. In the organic light-emitting display device of the present disclosure, however, the intersection of the touch wires is located in sub-pixels that emit the same color. Consequently, it is possible to considerably reduce the change in the color viewing angle even when the organic light-emitting display device is viewed at an oblique viewing angle.

Hereinafter, a comparison between the present disclosure, in which the touch wire is located in the sub-pixel having the largest light-emitting part of each pixel area, and a comparative example will be described.

Comparative Example

An organic light-emitting display device according to a comparative example is configured to have a structure in which a touch wire is located in an area between light-emitting parts, i.e. a bank.

In the structure of the comparative example, the touch wire is not visible when the organic light-emitting display device is viewed from the front. When the viewing angle is changed, however, deviation of the color viewing angle occurs, and thus sub-pixels located at the left and right sides of the touch wire or at the upper and lower sides of the touch wire are viewed as colors different from intended colors.

In addition, in the organic light-emitting display device of the comparative example, when the touch electrode array (the construction on the first substrate) and the organic light-emitting array (the construction on the second substrate) are misaligned after being laminated, all of the touch wires located in the non-light-emitting parts correspond to the light-emitting parts. This problem becomes more serious in a high-resolution structure, in which the non-light-emitting parts are narrow.

Figure 13:
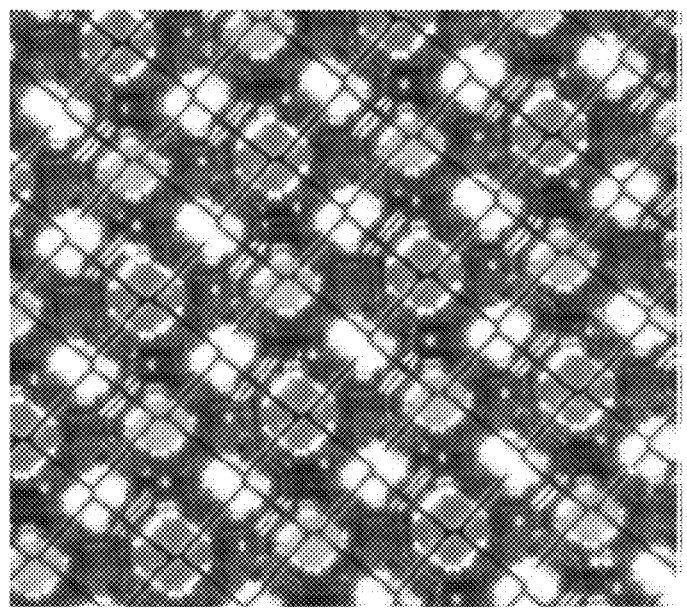
FIG. 13 is a plan view showing the state in which an organic light-emitting display device according to a comparative example is misaligned.
Figure 14:
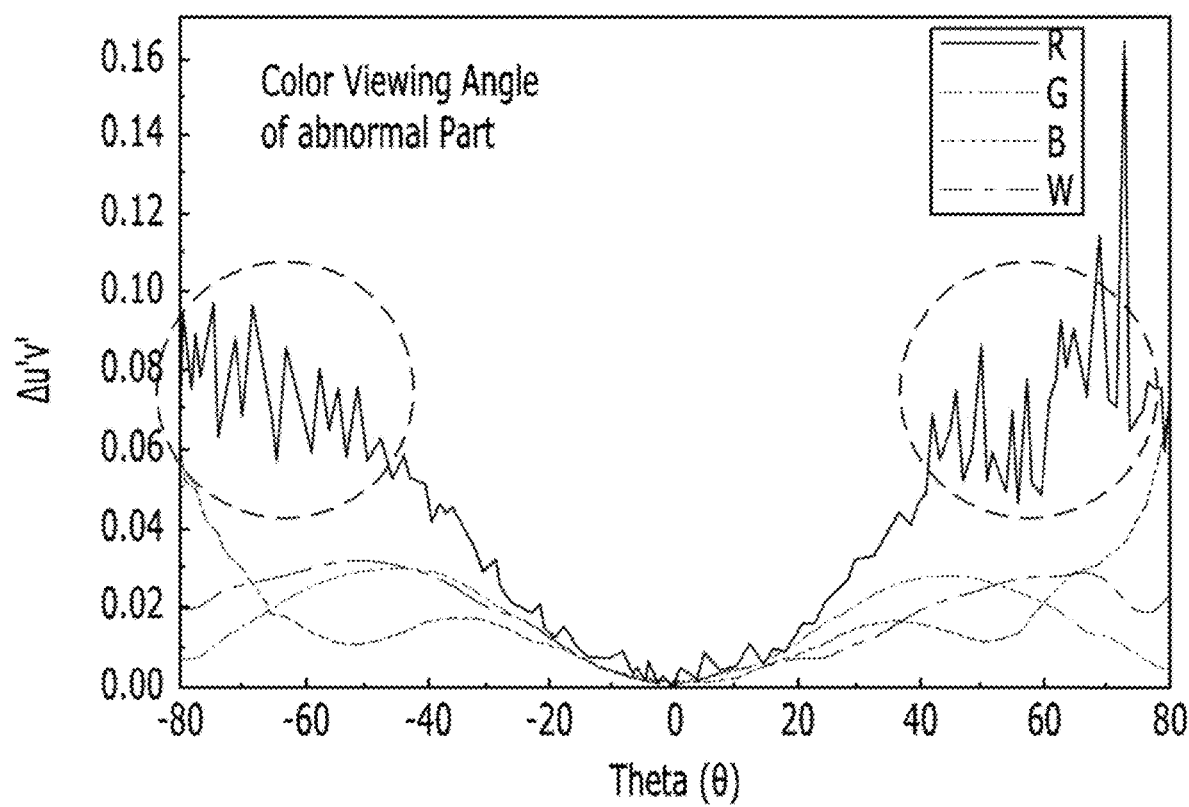
FIG. 14 is a graph showing a color viewing angle when the organic light-emitting display device of the comparative example is misaligned.

FIG. 13 is a plan view showing the state in which an organic light-emitting display device according to a comparative example is misaligned, and FIG. 14 is a graph showing a color viewing angle when the organic light-emitting display device of the comparative example is misaligned.

FIG. 13 shows the state in which the touch electrode array and the organic light-emitting array are misaligned, observed using an optical microscope. It can be seen that all touch wires are located in light-emitting parts.

FIG. 14 shows the case in which the change in the color viewing angle is increased toward the outside when the touch electrode array and the organic light-emitting array are misaligned and in which the change in the color viewing angle in the red sub-pixels is greater. It is considered that the area of the red sub-pixels is smaller than that of other sub-pixels, and therefore deviation of the color viewing angle has occurred since the area of the touch wires is the largest in the red sub-pixels when the touch wires that have the same width pass through the light-emitting parts of the sub-pixels.

In the organic light-emitting display device of the present disclosure, the relationship between the touch wires and the pixel areas is set as follows in order to solve the problem in which the touch wires are visible.

Relationship Between Touch Wires and Pixel Areas of the Present Disclosure

Table 1 shows whether the touch wires are visible when the intersection of the touch wires is provided in each light-emitting part, as shown in FIG. 13, and Table 2 shows whether the touch wire is visible when a touch wire extending in one direction is disposed in the first and second sub-pixels and touch wires extending in two directions are disposed in only the third sub-pixel having the largest light-emitting part so as to intersect each other, as shown in FIG. 3C.

TABLE 1

| | Area of Light-emitting part ($\mu m^2$) | Area of Touch wire ($\mu m^2$) | Area ratio (Touch wire/ Light-emitting part) | Visibility of Touch wire |
|---|---|---|---|---|
| First sub-pixel | 676 | 160.71 | 23.77% | ○ |
| Second sub-pixel | 600 | 154.11 | 25.69% | ○ |
| Third sub-pixel | 1296 | 276.71 | 21.35% | X |

TABLE 2

| | Area of Light-emitting part ($\mu m^2$) | Area of Touch wire ($\mu m^2$) | Area ratio (Touch wire/ Light-emitting part) | Visibility of Touch wire |
|---|---|---|---|---|
| First sub-pixel | 676 | 85.8 | 12.69% | X |
| Second sub-pixel | 600 | 66 to 99 | 11 to 16.5% | X |
| Third sub-pixel | 1296 | 276.71 | 21.35% | X |

That is, it can be seen from Table 1 that when the intersections are provided in the first and second sub-pixels having the relatively small light-emitting parts, the ratio of the area of the touch wire to that of the light-emitting part is 23.77% (exceeding 0.23 times), whereby the touch wire is visible, and that even when the intersection is provided in the third sub-pixel having the relatively large light-emitting part, the ratio of the area of the touch wire to that of the light-emitting part is 21.35%, whereby the touch wire is not visible.

In the organic light-emitting display device of the present disclosure, none of the touch wires corresponding to the light-emitting lights are visible, and visibility occurs depending on the ratio of the area occupied by the touch wire, as can be seen from Table 2. In this case, it can be seen that visibility does not occur when the ratio of the area occupied by the touch wire is 0.23 times or less.

In the organic light-emitting display device of the present disclosure, therefore, the touch wire is provided in the sub-pixel having the largest light-emitting part such that the ratio of the area occupied by the touch wires that intersect each other is 0.23 times or less the area of the light-emitting part of a corresponding sub-pixel, as shown in Table 2.

Referring to Table 2, the ratio of the area of the touch wire to that of the light-emitting part is 0.23 times or less in consideration of whether the touch wire is visible depending on the ratio of the area of the touch wire to that of the light-emitting part shown in Table 1. The intersection of the touch wires is provided only in the third sub-pixel, having the largest light-emitting part, and only the touch power extending in one direction is provided in the other first and second sub-pixels. It can be seen that the touch wire is not visible in all of the sub-pixels.

The above principle may be verified from the following equation.

Figure 15:
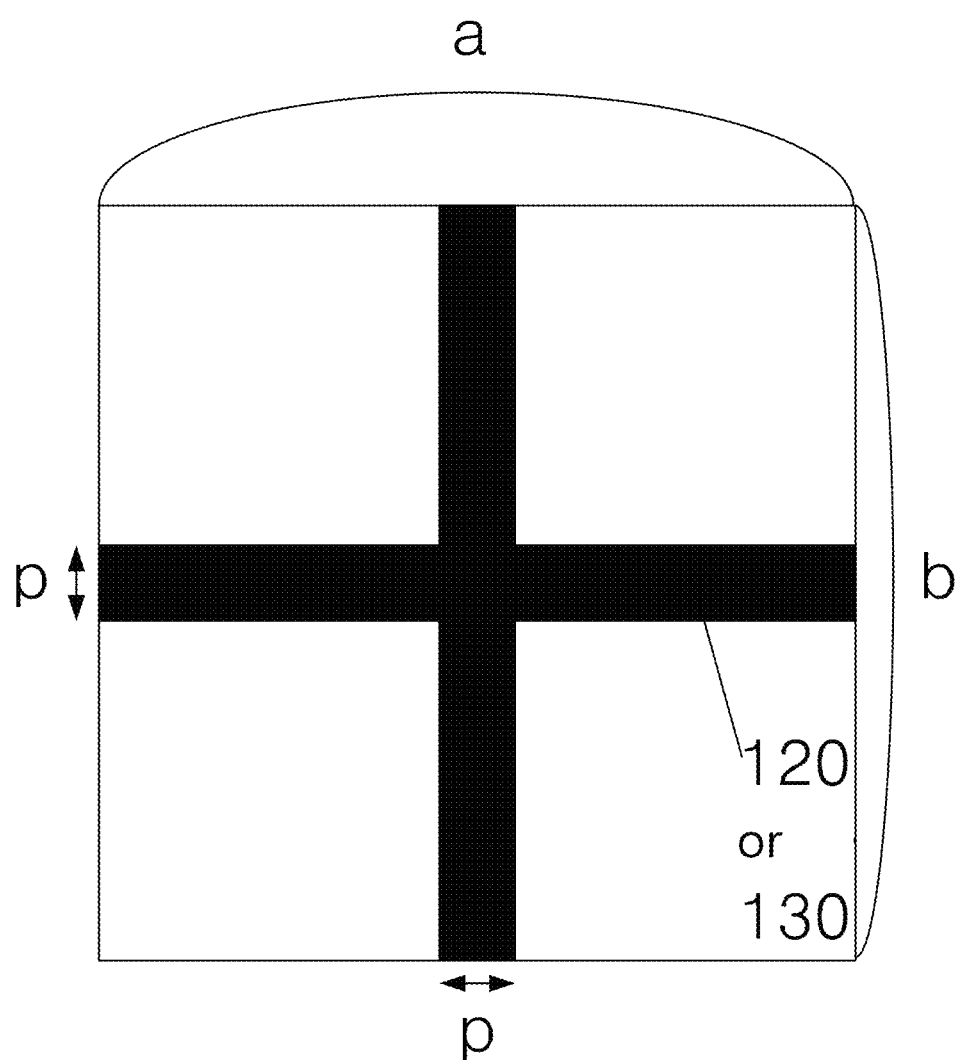
FIG. 15 is a plan view showing a sub-pixel of the organic light-emitting display device in which an intersection of touch wires appears.

FIG. 15 is a plan view showing a sub-pixel of the organic light-emitting display device of the present invention in which an intersection of touch wires appears.

When a sub-pixel has a light-emitting part having a width defined by a horizontal length 'a' and a vertical length 'b', as shown in FIG. 15, the area of the light-emitting part is 'a*b'.

In addition, when the touch wire 120 or 130 has a width of p in each direction, the area of the light-emitting part occupied by the touch wire is '$p*(a+b)-p^2$'.

In this case, the ratio of the area of the touch wire 120 or 130 to that of the light-emitting part is $\{p*(a+b)-p^2\}/(a*b)$. Here, the width of the touch wire 120 or 130 is several μm, and the length a or b of one side of the light-emitting part is several tens or several hundreds of μm. That is, 'a or b>>p'. On the assumption that the width p of the touch wire 120 or 130 is 1/10 or less the length a or b of one side of the light-emitting part of the sub-pixel having the largest area, the ratio of the area of the touch wire to that of the largest light-emitting part is about 0.2 or less.

In the case in which the touch wire is arranged obliquely with respect to the sub-pixels, rather than perpendicular or parallel to the sub-pixels, the ratio of the area of the touch wire to that of the light-emitting part of each sub-pixel may be slightly increased, and the ratios of the area of the touch wire to the areas of the light-emitting parts of the sub-pixels may be slightly different from each other. In any case, however, it is preferable for the area of the light-emitting part of the sub-pixel occupied by the touch wire to be a predetermined level (e.g. about 0.23 times) or less.

That is, in the organic light-emitting display device of the present disclosure, the width of the touch wire remains uniform, and the intersection of the touch wires, which is formed by the wires extending in the first and second directions, is located in the sub-pixel having the largest light-emitting part such that the ratio of the area of the touch wire to that of the light-emitting part is reduced, thereby preventing the touch wire from being visible.

In addition, the touch wire is located in the light-emitting part having a horizontal length and a vertical length equivalent to about 10 times or more of the width of the touch wire. Even when a touch wire that is located on another substrate and the sub-pixel are misaligned, therefore, the aligned touch wire is located in the light-emitting part. That is, the touch wire is located in the light-emitting part of the sub-pixel having the largest area irrespective of such misalignment. Consequently, the touch wire is aligned with the light-emitting part over the entire area, thereby reducing the occurrence of color deviation in respective areas.

As is apparent from the above description, the organic light-emitting display device according to the present disclosure has the following effects.

First, the intersection of the touch wires of the touch panel is located in the sub-pixel having the largest light-emitting part, thereby reducing the ratio of the area of the touch wire to that of the light-emitting part, and thus preventing the touch wire from being visible.

Second, the intersection of the touch wires is located in the sub-pixel having the largest light-emitting part, thereby reducing variation in the visibility of the touch wire in respective areas, compared to a structure in which the intersection of the touch wires is located in a bank (i.e. a non-light-emitting part). For example, in the structure in which the intersection of the touch wires is located in the bank, some of the touch wire is located in the light-emitting part when the touch electrode array and the organic light-emitting array are misaligned, with the result that the touch wire may be visible in the portion of a sub-pixel having a small light-emitting part on which the touch wire overlaps, which is prevented by the present invention. That is, the area occupied by the largest light-emitting part covers the portion in which misalignment may occur. Even in the case in which the touch electrode array and the organic light-emitting array are misaligned, therefore, there is no variation in the overlapping area between the touch wire in each area and the light-emitting part, since the touch wire of the touch electrode array is located in the largest light-emitting part, thereby reducing variation in visibility.

Third, the touch wire is located in the light-emitting parts, rather than in the banks. Consequently, it is possible to effectively prevent the touch wire from being visible in a high-resolution structure in which the width of the banks is reduced.

Fourth, a color viewing angle is improved. In the structure in which the touch wire is located in the banks, colors emitted by adjacent sub-pixels are affected by each other when the viewing angle is changed, i.e. when the organic light-emitting display device is not viewed from the front. In the organic light-emitting display device of the present disclosure, however, the intersection of the touch wires is located in sub-pixels that emit the same color. Consequently, it is possible to considerably reduce the change in the color viewing angle even when the organic light-emitting display device is viewed at an oblique viewing angle.

It will be apparent to those skilled in the art that various modifications and variations can be made in the present disclosure without departing from the spirit or scope of the invention. Thus, it is intended that the present invention covers the modifications and variations of this invention provided they come within the scope of the appended claims and their equivalents.

What is claimed is:

1. An organic light-emitting display device comprising:
   an organic light-emitting array comprising a plurality of pixel areas, each pixel area comprising at least two sub-pixels, the pixel areas being arranged in a matrix, wherein the at least two sub-pixels comprise light-emitting parts having different sizes and a bank around each of the light-emitting parts; and
   a plurality of blocks arranged into an array on the light emitting array, each of the blocks including:
      a plurality of first touch wires arranged in a first direction, and
      a plurality of second touch wires arranged in a second direction intersecting with the first touch wires,
      wherein each of intersection points of the first and second touch wires is at the light-emitting part of the sub-pixel which has a largest light-emitting part among the sub-pixels of each pixel area.

2. The organic light-emitting display device according to claim 1, wherein touch wires arranged in the first direction or the second direction at the sub-pixel which has the largest light-emitting part among the sub-pixels of each pixel area, are extended to the bank of the sub-pixel which has smaller light-emitting part among the sub-pixels of each pixel area.

3. The organic light-emitting display device according to claim 1, wherein the sub-pixel having smaller light-emitting part among the sub-pixels of each pixel area, the light-emitting part corresponds to one touch wire selected from a group consisting of:
   a first touch wire of the plurality of first touch wires arranged in the first direction, and
   a second touch wire of the plurality of touch wire arranged in the second direction.

4. The organic light-emitting display device according to claim 1, wherein a subset of sub-pixels having the largest light-emitting part among the pixel areas emits a same color.

5. The organic light-emitting display device according to claim 4, wherein the intersection points are located at same positions on each sub-pixel of the subset of sub-pixels.

6. The organic light-emitting display device according to claim 1, wherein
   each block of the plurality of blocks comprises a plurality of transmission parts arranged in a third direction and a plurality of reception parts arranged in a fourth direction, the transmission parts and the reception parts intersecting each other,
   a plurality of parts selected from the plurality of transmission parts and the plurality of reception parts has a connection electrode, provided at touch wires of adjacent blocks, between the adjacent blocks, and
   a plurality of parts selected from the plurality of transmission parts and the plurality of reception parts has a bridge electrode, provided on a layer different from a layer on which the touch wires of the adjacent blocks are provided, between the adjacent blocks.

7. The organic light-emitting display device according to claim 1, further comprising an island-shaped transparent conductive layer that abuts on the intersection points of touch wires.

8. The organic light-emitting display device according to claim 7, wherein the island-shaped transparent conductive layer has a width larger than widths of the touch wires in the first direction and the second direction.

9. The organic light-emitting display device according to claim 8, wherein the island-shaped transparent conductive layer is provided at intersections of touch wires along the first direction and the second direction.

10. The organic light-emitting display device according to claim 1, wherein each touch wire of the plurality of first touch wires and the plurality of second touch wires has a same width.

11. The organic light-emitting display device according to claim 1, further comprising an adhesive layer provided between the organic light-emitting array and the plurality of blocks.

12. The organic light-emitting display device according to claim 1, further comprising an encapsulation layer on the organic light-emitting array, wherein the plurality of blocks are formed on the encapsulation layer.

13. An organic light-emitting display device comprising:
   an organic light-emitting array comprising a plurality of pixel areas arranged in a matrix, each of the sub-pixels including a light-emitting part and a bank around the light-emitting part;
   a plurality of blocks arranged into an array on the light emitting array, each of the blocks including a plurality of first touch wires arranged in a first direction and a plurality of second touch wires arranged in a second direction intersecting with the first touch wires, and
   an adhesive layer located between the organic light-emitting array and the plurality of blocks, wherein each of pixel area of the plurality of pixel areas has at least first to third sub-pixels, the first to third sub-pixels being located at same positions in each of the pixel areas, the first sub-pixel of each of the pixel areas has a largest light-emitting part, and wherein each of intersection points of the first and second touch wires is at the first sub-pixel of each of the pixel area.

14. The organic light-emitting display device according to claim 13, wherein touch wires arranged in the first direction or the second direction are located in the bank of sub-pixels which have smaller light-emitting parts among the sub-pixels of each pixel area.

15. The organic light-emitting display device according to claim 13, wherein each light-emitting part of sub-pixels which have smaller light-emitting parts among the sub-pixels of each pixel area, corresponds to one touch wire selected from a group consisting of:

a first touch wire of the plurality of first touch wires arranged in the first direction, and a second touch wire of the plurality of touch wire arranged in the second direction.

16. The organic light-emitting display device according to claim 13, wherein the intersection points are located at same positions on each sub-pixel having the largest light-emitting part among the pixel areas.

17. The organic light-emitting display device according to claim 13, wherein the first direction is parallel to or intersect a direction in which the first sub-pixels are arranged.

18. The organic light-emitting display device according to claim 13, wherein the plurality of first touch wires and the plurality of second touch wires are formed of a metal selected from a group consisting of gold (Au), silver (Ag), palladium (Pd), copper (Cu), aluminum (Al), chrome (Cr), molybdenum (Mo), and titanium (Ti), or a metal stack or an alloy comprising at least one metal thereof.

19. The organic light-emitting display device according to claim 13, wherein each touch wire of the plurality of first touch wires and the plurality of second touch wires has a same width.

20. The organic light-emitting display device according to claim 13, wherein a ratio of an area of touch wires of the plurality of first and second touch wires to an area of each light-emitting part of sub-pixels is 0.23 times or less.

* * * * *